(12) United States Patent
Mai et al.

(10) Patent No.: US 11,755,206 B2
(45) Date of Patent: *Sep. 12, 2023

(54) BANK TO BANK DATA TRANSFER

(71) Applicant: Micron Technology, Inc., Boise, ID (US)

(72) Inventors: Thanh K. Mai, Allen, TX (US); Gary L. Howe, Plano, TX (US); Daniel B. Penney, Wylie, TX (US)

(73) Assignee: Micron Technology, Inc., Boise, ID (US)

( * ) Notice: Subject to any disclaimer, the term of this patent is extended or adjusted under 35 U.S.C. 154(b) by 84 days.

This patent is subject to a terminal disclaimer.

(21) Appl. No.: 17/178,889

(22) Filed: Feb. 18, 2021

(65) Prior Publication Data
US 2021/0173557 A1 Jun. 10, 2021

Related U.S. Application Data

(63) Continuation of application No. 16/541,764, filed on Aug. 15, 2019, now Pat. No. 10,929,023, which is a continuation of application No. 15/189,900, filed on Jun. 22, 2016, now Pat. No. 10,387,046.

(51) Int. Cl.
G06F 3/06 (2006.01)
G11C 8/00 (2006.01)
G06F 13/16 (2006.01)

(52) U.S. Cl.
CPC ............ *G06F 3/061* (2013.01); *G06F 3/0625* (2013.01); *G06F 3/0646* (2013.01); *G06F 3/0647* (2013.01); *G06F 3/0656* (2013.01); *G06F 3/0659* (2013.01); *G06F 3/0673* (2013.01);
(Continued)

(58) Field of Classification Search
CPC ...... G06F 3/061; G06F 3/0625; G06F 3/0646; G06F 3/0647; G06F 3/0656; G06F 3/0659; G06F 3/0673; G06F 13/161; G11C 8/00; G11C 7/1006; Y02D 10/00
See application file for complete search history.

(56) References Cited

U.S. PATENT DOCUMENTS

| 4,380,046 A | 4/1983 | Fung |
| 4,435,792 A | 3/1984 | Bechtolsheim |
| 4,435,793 A | 3/1984 | Ochii |

(Continued)

FOREIGN PATENT DOCUMENTS

| CN | 101310339 | 11/2008 |
| CN | 101401166 | 4/2009 |

(Continued)

OTHER PUBLICATIONS

Office Action for related China Patent Application No. 201780038377.8, dated Nov. 12, 2019, 31 pages.

(Continued)

*Primary Examiner* — Jay W. Radke
(74) *Attorney, Agent, or Firm* — Brooks, Cameron & Huebsch, PLLC

(57) ABSTRACT

The present disclosure includes apparatuses and methods to transfer data between banks of memory cells. An example includes a plurality of banks of memory cells and a controller coupled to the plurality of subarrays configured to cause transfer of data between the plurality of banks of memory cells via internal data path operations.

18 Claims, 7 Drawing Sheets

(52) U.S. Cl.
CPC .............. *G06F 13/161* (2013.01); *G11C 8/00* (2013.01); *Y02D 10/00* (2018.01)

(56) References Cited

U.S. PATENT DOCUMENTS

| | | |
|---|---|---|
| 4,727,474 A | 2/1988 | Batcher |
| 4,843,264 A | 6/1989 | Galbraith |
| 4,958,378 A | 9/1990 | Bell |
| 4,977,542 A | 12/1990 | Matsuda et al. |
| 5,023,838 A | 6/1991 | Herbert |
| 5,034,636 A | 7/1991 | Reis et al. |
| 5,201,039 A | 4/1993 | Sakamura |
| 5,210,850 A | 5/1993 | Kelly et al. |
| 5,253,308 A | 10/1993 | Johnson |
| 5,263,003 A * | 11/1993 | Cowles ............... G11C 7/1045 365/185.11 |
| 5,276,643 A | 1/1994 | Hoffmann et al. |
| 5,325,519 A | 6/1994 | Long et al. |
| 5,367,488 A | 11/1994 | An |
| 5,379,257 A | 1/1995 | Matsumura et al. |
| 5,386,379 A | 1/1995 | Ali-Yahia et al. |
| 5,398,213 A | 3/1995 | Yeon et al. |
| 5,440,482 A | 8/1995 | Davis |
| 5,446,690 A | 8/1995 | Tanaka et al. |
| 5,473,576 A | 12/1995 | Matsui |
| 5,481,500 A | 1/1996 | Reohr et al. |
| 5,485,373 A | 1/1996 | Davis et al. |
| 5,506,811 A | 4/1996 | McLaury |
| 5,615,404 A | 3/1997 | Knoll et al. |
| 5,638,128 A | 6/1997 | Hoogenboom |
| 5,638,317 A | 6/1997 | Tran |
| 5,654,936 A | 8/1997 | Cho |
| 5,678,021 A | 10/1997 | Pawate et al. |
| 5,724,291 A | 3/1998 | Matano |
| 5,724,366 A | 3/1998 | Furutani |
| 5,751,987 A | 5/1998 | Mahant-Shetti et al. |
| 5,787,458 A | 7/1998 | Miwa |
| 5,854,636 A | 12/1998 | Watanabe et al. |
| 5,867,429 A | 2/1999 | Chen et al. |
| 5,870,504 A | 2/1999 | Nemoto et al. |
| 5,915,084 A | 6/1999 | Wendell |
| 5,935,263 A | 8/1999 | Keeth et al. |
| 5,986,942 A | 11/1999 | Sugibayashi |
| 5,991,209 A | 11/1999 | Chow |
| 5,991,785 A | 11/1999 | Alidina et al. |
| 6,005,799 A | 12/1999 | Rao |
| 6,009,020 A | 12/1999 | Nagata |
| 6,092,186 A | 7/2000 | Betker et al. |
| 6,122,211 A | 9/2000 | Morgan et al. |
| 6,125,071 A | 9/2000 | Kohno et al. |
| 6,134,164 A | 10/2000 | Lattimore et al. |
| 6,147,514 A | 11/2000 | Shiratake |
| 6,151,244 A | 11/2000 | Fujino et al. |
| 6,157,578 A | 12/2000 | Brady |
| 6,163,862 A | 12/2000 | Adams et al. |
| 6,166,942 A | 12/2000 | Vo et al. |
| 6,172,918 B1 | 1/2001 | Hidaka |
| 6,175,514 B1 | 1/2001 | Henderson |
| 6,181,698 B1 | 1/2001 | Hariguchi |
| 6,208,544 B1 | 3/2001 | Beadle et al. |
| 6,226,215 B1 | 5/2001 | Yoon |
| 6,301,153 B1 | 10/2001 | Takeuchi et al. |
| 6,301,164 B1 | 10/2001 | Manning et al. |
| 6,304,477 B1 | 10/2001 | Naji |
| 6,389,507 B1 | 5/2002 | Sherman |
| 6,418,498 B1 | 7/2002 | Martwick |
| 6,466,499 B1 | 10/2002 | Blodgett |
| 6,510,098 B1 | 1/2003 | Taylor |
| 6,563,754 B1 | 5/2003 | Lien et al. |
| 6,578,058 B1 | 6/2003 | Nygaard |
| 6,622,224 B1 | 9/2003 | Cloud |
| 6,658,509 B1 | 12/2003 | Bonella et al. |
| 6,731,542 B1 | 5/2004 | Le et al. |
| 6,754,746 B1 | 6/2004 | Leung et al. |
| 6,768,679 B1 | 7/2004 | Le et al. |
| 6,807,614 B2 | 10/2004 | Chung |
| 6,809,964 B2 | 10/2004 | Moschopoulus et al. |
| 6,816,422 B2 | 11/2004 | Hamade et al. |
| 6,819,612 B1 | 11/2004 | Achter |
| 6,894,549 B2 | 5/2005 | Eliason |
| 6,943,579 B1 | 9/2005 | Hazanchuk et al. |
| 6,948,056 B1 | 9/2005 | Roth et al. |
| 6,950,771 B1 | 9/2005 | Fan et al. |
| 6,950,898 B2 | 9/2005 | Merritt et al. |
| 6,956,770 B2 | 10/2005 | Khalid et al. |
| 6,961,272 B2 | 11/2005 | Schreck |
| 6,965,648 B1 | 11/2005 | Smith et al. |
| 6,985,394 B2 | 1/2006 | Kim |
| 6,987,693 B2 | 1/2006 | Cernea et al. |
| 7,020,017 B2 | 3/2006 | Chen et al. |
| 7,028,170 B2 | 4/2006 | Saulsbury |
| 7,045,834 B2 | 5/2006 | Tran et al. |
| 7,054,178 B1 | 5/2006 | Shiah et al. |
| 7,061,817 B2 | 6/2006 | Raad et al. |
| 7,079,407 B1 | 7/2006 | Dimitrelis |
| 7,173,857 B2 | 2/2007 | Kato et al. |
| 7,187,585 B2 | 3/2007 | Li et al. |
| 7,196,928 B2 | 3/2007 | Chen |
| 7,260,015 B2 | 8/2007 | Jeddeloh |
| 7,260,565 B2 | 8/2007 | Lee et al. |
| 7,260,672 B2 | 8/2007 | Garney |
| 7,372,715 B2 | 5/2008 | Han |
| 7,400,532 B2 | 7/2008 | Aritome |
| 7,406,494 B2 | 7/2008 | Magee |
| 7,447,720 B2 | 11/2008 | Beaumont |
| 7,454,451 B2 | 11/2008 | Beaumont |
| 7,457,181 B2 | 11/2008 | Lee et al. |
| 7,535,769 B2 | 5/2009 | Cernea |
| 7,546,438 B2 | 6/2009 | Chung |
| 7,562,198 B2 | 7/2009 | Noda et al. |
| 7,574,466 B2 | 8/2009 | Beaumont |
| 7,602,647 B2 | 10/2009 | Li et al. |
| 7,663,928 B2 | 2/2010 | Tsai et al. |
| 7,685,365 B2 | 3/2010 | Rajwar et al. |
| 7,692,466 B2 | 4/2010 | Ahmadi |
| 7,752,417 B2 | 7/2010 | Manczak et al. |
| 7,791,962 B2 | 9/2010 | Noda et al. |
| 7,796,453 B2 | 9/2010 | Riho et al. |
| 7,805,587 B1 | 9/2010 | Van Dyke et al. |
| 7,808,854 B2 | 10/2010 | Takase |
| 7,827,372 B2 | 11/2010 | Bink et al. |
| 7,869,273 B2 | 1/2011 | Lee et al. |
| 7,898,864 B2 | 3/2011 | Dong |
| 7,924,628 B2 | 4/2011 | Danon et al. |
| 7,937,535 B2 | 5/2011 | Ozer et al. |
| 7,957,206 B2 | 6/2011 | Bauser |
| 7,979,667 B2 | 7/2011 | Allen et al. |
| 7,996,749 B2 | 8/2011 | Ding et al. |
| 8,031,552 B2 | 10/2011 | Chung et al. |
| 8,042,082 B2 | 10/2011 | Solomon |
| 8,045,391 B2 | 10/2011 | Mokhlesi |
| 8,059,438 B2 | 11/2011 | Chang et al. |
| 8,095,825 B2 | 1/2012 | Hirotsu et al. |
| 8,117,462 B2 | 2/2012 | Snapp et al. |
| 8,164,942 B2 | 4/2012 | Gebara et al. |
| 8,208,328 B2 | 6/2012 | Hong |
| 8,213,248 B2 | 7/2012 | Moon et al. |
| 8,223,568 B2 | 7/2012 | Seo |
| 8,238,173 B2 | 8/2012 | Akerib et al. |
| 8,274,841 B2 | 9/2012 | Shimano et al. |
| 8,279,683 B2 | 10/2012 | Klein |
| 8,310,884 B2 | 11/2012 | Iwai et al. |
| 8,332,367 B2 | 12/2012 | Bhattacherjee et al. |
| 8,339,824 B2 | 12/2012 | Cooke |
| 8,339,883 B2 | 12/2012 | Yu et al. |
| 8,347,154 B2 | 1/2013 | Bahali et al. |
| 8,351,292 B2 | 1/2013 | Matano |
| 8,356,144 B2 | 1/2013 | Hessel et al. |
| 8,417,921 B2 | 4/2013 | Gonion et al. |
| 8,462,532 B1 | 6/2013 | Argyres |
| 8,484,276 B2 | 7/2013 | Carlson et al. |
| 8,495,438 B2 | 7/2013 | Roine |
| 8,503,250 B2 | 8/2013 | Demone |
| 8,526,239 B2 | 9/2013 | Kim |

(56) References Cited

U.S. PATENT DOCUMENTS

| | | |
|---|---|---|
| 8,533,245 B1 | 9/2013 | Cheung |
| 8,555,037 B2 | 10/2013 | Gonion |
| 8,599,613 B2 | 12/2013 | Abiko et al. |
| 8,605,015 B2 | 12/2013 | Guttag et al. |
| 8,625,376 B2 | 1/2014 | Jung et al. |
| 8,644,101 B2 | 2/2014 | Jun et al. |
| 8,650,232 B2 | 2/2014 | Stortz et al. |
| 8,873,272 B2 | 10/2014 | Lee |
| 8,964,496 B2 | 2/2015 | Manning |
| 8,971,124 B1 | 3/2015 | Manning |
| 9,015,390 B2 | 4/2015 | Klein |
| 9,047,193 B2 | 6/2015 | Lin et al. |
| 9,165,023 B2 | 10/2015 | Moskovich et al. |
| 10,387,046 B2 * | 8/2019 | Mai .................. G06F 3/0659 |
| 10,929,023 B2 * | 2/2021 | Mai .................. G06F 3/0646 |
| 2001/0007112 A1 | 7/2001 | Porterfield |
| 2001/0008492 A1 | 7/2001 | Higashiho |
| 2001/0010057 A1 | 7/2001 | Yamada |
| 2001/0028584 A1 | 10/2001 | Nakayama et al. |
| 2001/0043089 A1 | 11/2001 | Forbes et al. |
| 2002/0059355 A1 | 5/2002 | Peleg et al. |
| 2002/0084458 A1 | 7/2002 | Halbert et al. |
| 2003/0002378 A1 | 1/2003 | Uchida et al. |
| 2003/0033431 A1 | 2/2003 | Shinomiya |
| 2003/0043627 A1 | 3/2003 | Moschopoulus et al. |
| 2003/0167426 A1 | 9/2003 | Slobodnik |
| 2003/0204689 A1 | 10/2003 | Shimoda |
| 2003/0222879 A1 | 12/2003 | Lin et al. |
| 2004/0001356 A1 | 1/2004 | Kawamura et al. |
| 2004/0027857 A1 | 2/2004 | Ooishi |
| 2004/0073592 A1 | 4/2004 | Kim et al. |
| 2004/0073773 A1 | 4/2004 | Demjanenko |
| 2004/0085840 A1 | 5/2004 | Vali et al. |
| 2004/0095826 A1 | 5/2004 | Perner |
| 2004/0123067 A1 * | 6/2004 | Sprangle .......... G06F 13/1631 711/219 |
| 2004/0154002 A1 | 8/2004 | Ball et al. |
| 2004/0205289 A1 | 10/2004 | Srinivasan |
| 2004/0240251 A1 | 12/2004 | Nozawa et al. |
| 2004/0264286 A1 | 12/2004 | Ware et al. |
| 2005/0015557 A1 | 1/2005 | Wang et al. |
| 2005/0047255 A1 | 3/2005 | Park et al. |
| 2005/0062500 A1 | 3/2005 | George |
| 2005/0078514 A1 | 4/2005 | Scheuerlein et al. |
| 2005/0097417 A1 | 5/2005 | Agrawal et al. |
| 2006/0047937 A1 | 3/2006 | Selvaggi et al. |
| 2006/0069849 A1 | 3/2006 | Rudelic |
| 2006/0136687 A1 * | 6/2006 | Conley ................ G11C 16/10 711/162 |
| 2006/0146623 A1 | 7/2006 | Mizuno et al. |
| 2006/0149804 A1 | 7/2006 | Luick et al. |
| 2006/0181917 A1 | 8/2006 | Kang et al. |
| 2006/0215432 A1 | 9/2006 | Wickeraad et al. |
| 2006/0225072 A1 | 10/2006 | Lari et al. |
| 2006/0259659 A1 | 11/2006 | Castille et al. |
| 2006/0291282 A1 | 12/2006 | Liu et al. |
| 2007/0025173 A1 | 2/2007 | Cullum et al. |
| 2007/0103986 A1 | 5/2007 | Chen |
| 2007/0171747 A1 | 7/2007 | Hunter et al. |
| 2007/0180006 A1 | 8/2007 | Gyoten et al. |
| 2007/0180184 A1 | 8/2007 | Sakashita et al. |
| 2007/0195602 A1 | 8/2007 | Fong et al. |
| 2007/0285131 A1 | 12/2007 | Sohn |
| 2007/0285979 A1 | 12/2007 | Turner |
| 2007/0291532 A1 | 12/2007 | Tsuji |
| 2008/0025073 A1 | 1/2008 | Arsovski |
| 2008/0037333 A1 | 2/2008 | Kim et al. |
| 2008/0052711 A1 | 2/2008 | Forin et al. |
| 2008/0137388 A1 | 6/2008 | Krishnan et al. |
| 2008/0165601 A1 | 7/2008 | Matick et al. |
| 2008/0178053 A1 | 7/2008 | Gorman et al. |
| 2008/0215937 A1 | 9/2008 | Dreibelbis et al. |
| 2008/0229000 A1 | 9/2008 | Kim |
| 2009/0067218 A1 | 3/2009 | Graber |
| 2009/0154238 A1 | 6/2009 | Lee |
| 2009/0154273 A1 | 6/2009 | Borot et al. |
| 2009/0254697 A1 | 10/2009 | Akerib |
| 2010/0037014 A1 | 2/2010 | Lim et al. |
| 2010/0067296 A1 | 3/2010 | Li |
| 2010/0091582 A1 | 4/2010 | Vali et al. |
| 2010/0172190 A1 | 7/2010 | Lavi et al. |
| 2010/0210076 A1 | 8/2010 | Gruber et al. |
| 2010/0226183 A1 | 9/2010 | Kim |
| 2010/0287326 A1 | 11/2010 | Chou et al. |
| 2010/0308858 A1 | 12/2010 | Noda et al. |
| 2010/0329027 A1 | 12/2010 | Kang |
| 2010/0332895 A1 | 12/2010 | Billing et al. |
| 2011/0007583 A1 | 1/2011 | Lee et al. |
| 2011/0051523 A1 | 3/2011 | Manabe et al. |
| 2011/0063919 A1 | 3/2011 | Chandrasekhar et al. |
| 2011/0093662 A1 | 4/2011 | Walker et al. |
| 2011/0103151 A1 | 5/2011 | Kim et al. |
| 2011/0119467 A1 | 5/2011 | Cadambi et al. |
| 2011/0122695 A1 | 5/2011 | Li et al. |
| 2011/0140741 A1 | 6/2011 | Zerbe et al. |
| 2011/0219260 A1 | 9/2011 | Nobunaga et al. |
| 2011/0267883 A1 | 11/2011 | Lee et al. |
| 2011/0317496 A1 | 12/2011 | Bunce et al. |
| 2012/0005397 A1 | 1/2012 | Lim et al. |
| 2012/0011331 A1 | 1/2012 | Ware et al. |
| 2012/0017039 A1 | 1/2012 | Margetts |
| 2012/0023281 A1 | 1/2012 | Kawasaki et al. |
| 2012/0120705 A1 | 5/2012 | Mitsubori et al. |
| 2012/0134216 A1 | 5/2012 | Singh |
| 2012/0134225 A1 | 5/2012 | Chow |
| 2012/0134226 A1 | 5/2012 | Chow |
| 2012/0140540 A1 | 6/2012 | Agam et al. |
| 2012/0182798 A1 | 7/2012 | Hosono et al. |
| 2012/0195146 A1 | 8/2012 | Jun et al. |
| 2012/0198310 A1 | 8/2012 | Tran et al. |
| 2012/0246380 A1 | 9/2012 | Akerib et al. |
| 2012/0265964 A1 | 10/2012 | Murata et al. |
| 2012/0281486 A1 | 11/2012 | Rao et al. |
| 2012/0303627 A1 | 11/2012 | Keeton et al. |
| 2013/0003467 A1 | 1/2013 | Klein |
| 2013/0061006 A1 | 3/2013 | Hein |
| 2013/0073753 A1 | 3/2013 | Matsushige et al. |
| 2013/0107623 A1 | 5/2013 | Kavalipurapu et al. |
| 2013/0117541 A1 | 5/2013 | Choquette et al. |
| 2013/0124783 A1 | 5/2013 | Yoon et al. |
| 2013/0132702 A1 | 5/2013 | Patel et al. |
| 2013/0138646 A1 | 5/2013 | Sirer et al. |
| 2013/0163362 A1 | 6/2013 | Kim |
| 2013/0173888 A1 | 7/2013 | Hansen et al. |
| 2013/0205114 A1 | 8/2013 | Badam et al. |
| 2013/0219112 A1 | 8/2013 | Okin et al. |
| 2013/0227361 A1 | 8/2013 | Bowers et al. |
| 2013/0283122 A1 | 10/2013 | Anholt et al. |
| 2013/0286705 A1 | 10/2013 | Grover et al. |
| 2013/0311717 A1 | 11/2013 | Kim et al. |
| 2013/0326154 A1 | 12/2013 | Haswell |
| 2013/0332707 A1 | 12/2013 | Gueron et al. |
| 2014/0185395 A1 | 7/2014 | Seo |
| 2014/0215185 A1 | 7/2014 | Danielsen |
| 2014/0250279 A1 | 9/2014 | Manning |
| 2014/0344934 A1 | 11/2014 | Jorgensen |
| 2015/0029798 A1 | 1/2015 | Manning |
| 2015/0042380 A1 | 2/2015 | Manning |
| 2015/0063052 A1 | 3/2015 | Manning |
| 2015/0078108 A1 | 3/2015 | Cowles et al. |
| 2015/0120987 A1 | 4/2015 | Wheeler |
| 2015/0134713 A1 | 5/2015 | Wheeler |
| 2015/0270015 A1 | 9/2015 | Murphy et al. |
| 2015/0279466 A1 | 10/2015 | Manning |
| 2015/0324290 A1 | 11/2015 | Leidel |
| 2015/0325272 A1 | 11/2015 | Murphy |
| 2015/0356009 A1 | 12/2015 | Wheeler et al. |
| 2015/0356022 A1 | 12/2015 | Leidel et al. |
| 2015/0357007 A1 | 12/2015 | Manning et al. |
| 2015/0357008 A1 | 12/2015 | Manning et al. |
| 2015/0357019 A1 | 12/2015 | Wheeler et al. |
| 2015/0357020 A1 | 12/2015 | Manning |
| 2015/0357021 A1 | 12/2015 | Hush |
| 2015/0357022 A1 | 12/2015 | Hush |

(56) References Cited

U.S. PATENT DOCUMENTS

| | | |
|---|---|---|
| 2015/0357023 A1 | 12/2015 | Hush |
| 2015/0357024 A1 | 12/2015 | Hush et al. |
| 2015/0357047 A1 | 12/2015 | Tiwari |
| 2016/0062672 A1 | 3/2016 | Wheeler |
| 2016/0062673 A1 | 3/2016 | Tiwari |
| 2016/0062692 A1 | 3/2016 | Finkbeiner et al. |
| 2016/0062733 A1 | 3/2016 | Tiwari |
| 2016/0063284 A1 | 3/2016 | Tiwari |
| 2016/0064045 A1 | 3/2016 | La Fratta |
| 2016/0064047 A1 | 3/2016 | Tiwari |
| 2016/0098208 A1 | 4/2016 | Willcock |
| 2016/0098209 A1 | 4/2016 | Leidel et al. |
| 2016/0110135 A1 | 4/2016 | Wheeler et al. |
| 2016/0125919 A1 | 5/2016 | Hush |
| 2016/0147460 A1 | 5/2016 | Sohn et al. |
| 2016/0154596 A1 | 6/2016 | Willcock et al. |
| 2016/0155482 A1 | 6/2016 | La Fratta |
| 2016/0283114 A1 | 9/2016 | Kimura |
| 2016/0306588 A1 | 10/2016 | Li et al. |
| 2018/0024769 A1 | 1/2018 | Howe et al. |
| 2018/0024926 A1 | 1/2018 | Penney et al. |
| 2020/0135261 A1 | 4/2020 | Haraguchi et al. |

FOREIGN PATENT DOCUMENTS

| | | |
|---|---|---|
| CN | 102141905 | 8/2011 |
| EP | 0214718 | 3/1987 |
| EP | 2026209 | 2/2009 |
| JP | H0831168 | 2/1996 |
| JP | 2012522311 | 9/2012 |
| JP | 2009259193 | 3/2015 |
| KR | 10-0211482 | 8/1998 |
| KR | 10-2010-0134235 | 12/2010 |
| KR | 10-2013-0049421 | 5/2013 |
| TW | 200818212 | 4/2008 |
| TW | 201349236 | 12/2013 |
| WO | 2001065359 | 9/2001 |
| WO | 2010079451 | 7/2010 |
| WO | 2013062596 | 5/2013 |
| WO | 2013081588 | 6/2013 |
| WO | 2013095592 | 6/2013 |

OTHER PUBLICATIONS

Notice of Rejection for related Korea Patent Application No. 10-2019-7000206, dated Feb. 26, 2020, 16 pages.
Notice of Reasons for Rejection for related Korea Patent Application No. 10-2019-7000206, dated Sep. 17, 2020, 18 pages.
Decision of Rejection for related Korea Patent Application No. 10-2019-7000206, dated Feb. 22, 2021, 8 pages.
Boyd et al., "On the General Applicability of Instruction-Set Randomization", Jul.-Sep. 2010, (14 pgs.), vol. 7, Issue 3, IEEE Transactions on Dependable and Secure Computing.
Stojmenovic, "Multiplicative Circulant Networks Topological Properties and Communication Algorithms", (25 pgs.), Discrete Applied Mathematics 77 (1997) 281-305.
"4.9.3 MINLOC and MAXLOC", Jun. 12, 1995, (5pgs.), Message Passing Interface Forum 1.1, retrieved from http://www.mpi-forum.org/docs/mpi-1.1/mpi-11-html/node79.html.
Derby, et al., "A High-Performance Embedded DSP Core with Novel SIMD Features", Apr. 6-10, 2003, (4 pgs), vol. 2, pp. 301-304, 2003 IEEE International Conference on Accoustics, Speech, and Signal Processing.
Debnath, Biplob, Bloomflash: Bloom Filter on Flash-Based Storage, 2011 31st Annual Conference on Distributed Computing Systems, Jun. 20-24, 2011, 10 pgs.
Pagiamtzis, Kostas, "Content-Addressable Memory Introduction", Jun. 25, 2007, (6 pgs.), retrieved from: http://www.pagiamtzis.com/cam/camintro.
Pagiamtzis, et al., "Content-Addressable Memory (CAM) Circuits and Architectures: A Tutorial and Survey", Mar. 2006, (16 pgs.), vol. 41, No. 3, IEEE Journal of Solid-State Circuits.
International Search Report and Written Opinion for PCT Application No. PCT/US2013/043702, dated Sep. 26, 2013, (11 pgs.).
Elliot, et al., "Computational RAM: Implementing Processors in Memory", Jan.-Mar. 1999, (10 pgs.), vol. 16, Issue 1, IEEE Design and Test of Computers Magazine.
Dybdahl, et al., "Destructive-Read in Embedded DRAM, Impact on Power Consumption," Apr. 2006, (10 pgs.), vol. 2, Issue 2, Journal of Embedded Computing-Issues in embedded single-chip multicore architectures.
Kogge, et al., "Processing in Memory: Chips to Petaflops," May 23, 1997, (8 pgs.), retrieved from: http://www.cs.ucf.edu/courses/cda5106/summer02/papers/kogge97PIM.pdf.
Draper, et al., "The Architecture of the DIVA Processing-In-Memory Chip," Jun. 22-26, 2002, (12 pgs.), ICS '02, retrieved from: http://www.isi.edu/~draper/papers/ics02.pdf.
Adibi, et al., "Processing-In-Memory Technology for Knowledge Discovery Algorithms," Jun. 25, 2006, (10 pgs.), Proceeding of the Second International Workshop on Data Management on New Hardware, retrieved from: http://www.cs.cmu.edu/~damon2006/pdf/adibi06inmemory.pdf.
U.S. Appl. No. 13/449,082, entitled, "Methods and Apparatus for Pattern Matching," filed Apr. 17, 2012, (37 pgs.).
U.S. Appl. No. 13/743,686, entitled, "Weighted Search and Compare in a Memory Device," filed Jan. 17, 2013, (25 pgs.).
U.S. Appl. No. 13/774,636, entitled, "Memory as a Programmable Logic Device," filed Feb. 22, 2013, (30 pgs.).
U.S. Appl. No. 13/774,553, entitled, "Neural Network in a Memory Device," filed Feb. 22, 2013, (63 pgs.).
U.S. Appl. No. 13/796,189, entitled, "Performing Complex Arithmetic Functions in a Memory Device," filed Mar. 12, 2013, (23 pgs.).
International Search Report and Written Opinion for related PCT Application No. PCT/US2017/037172, dated Sep. 25, 2017, 15 pages.
Office Action for related Taiwan Patent Application No. 106120753, dated Jan. 24, 2018, 18 pages.
Office Action for related Taiwan Patent Application No. 106120753, dated Sep. 17, 2018, 18 pages.

\* cited by examiner

BANK TO BANK DATA TRANSFER

PRIORITY INFORMATION

This application is a Continuation of U.S. application Ser. No. 16/541,764, filed Aug. 15, 2019, which is a Continuation of U.S. application Ser. No. 15/189,900, filed Jun. 22, 2016, which issues as U.S. Pat. No. 10,387,046 on Aug. 20, 2019, the contents of which are included herein by reference.

TECHNICAL FIELD

The present disclosure relates generally to semiconductor memory and methods, and more particularly, to apparatuses and methods to bank to bank data transfer.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Electronic systems often include a number of processing resources (e.g., one or more processors), which may retrieve and execute instructions and store the results of the executed instructions to a suitable location. A processor can comprise a number of functional units such as arithmetic logic unit (ALU) circuitry, floating point unit (FPU) circuitry, and a combinatorial logic block, for example, which can be used to execute instructions by performing an operation on data (e.g., one or more operands). As used herein, an operation can be, for example, a Boolean operation, such as AND, OR, NOT, NAND, NOR, and XOR, and/or other operations (e.g., invert, shift, arithmetic, statistics, among many other possible operations). For example, functional unit circuitry may be used to perform the arithmetic operations, such as addition, subtraction, multiplication, and division on operands, via a number of operations.

A number of components in an electronic system may be involved in providing instructions to the functional unit circuitry for execution. The instructions may be executed, for instance, by a processing resource such as a controller and/or host processor. Data (e.g., the operands on which the instructions will be executed) may be stored in a memory array that is accessible by the functional unit circuitry. The instructions and/or data may be retrieved from the memory array and sequenced and/or buffered before the functional unit circuitry begins to execute instructions on the data. Furthermore, as different types of operations may be executed in one or multiple clock cycles through the functional unit circuitry, intermediate results of the instructions and/or data may also be sequenced and/or buffered. A sequence to complete an operation in one or more clock cycles may be referred to as an operation cycle. Time consumed to complete an operation cycle costs in terms of processing and computing performance and power consumption, of a computing apparatus and/or system.

In many instances, the processing resources (e.g., processor and associated functional unit circuitry) may be external to the memory array, and data is accessed via a bus between the processing resources and the memory array to execute a set of instructions. Processing performance may be improved in a processor-in-memory device, in which a processor may be implemented internally and near to a memory (e.g., directly on a same chip as the memory array). A processing-in-memory device may save time by reducing and eliminating external communications and may also conserve power.

DETAILED DESCRIPTION

Figure 1A:
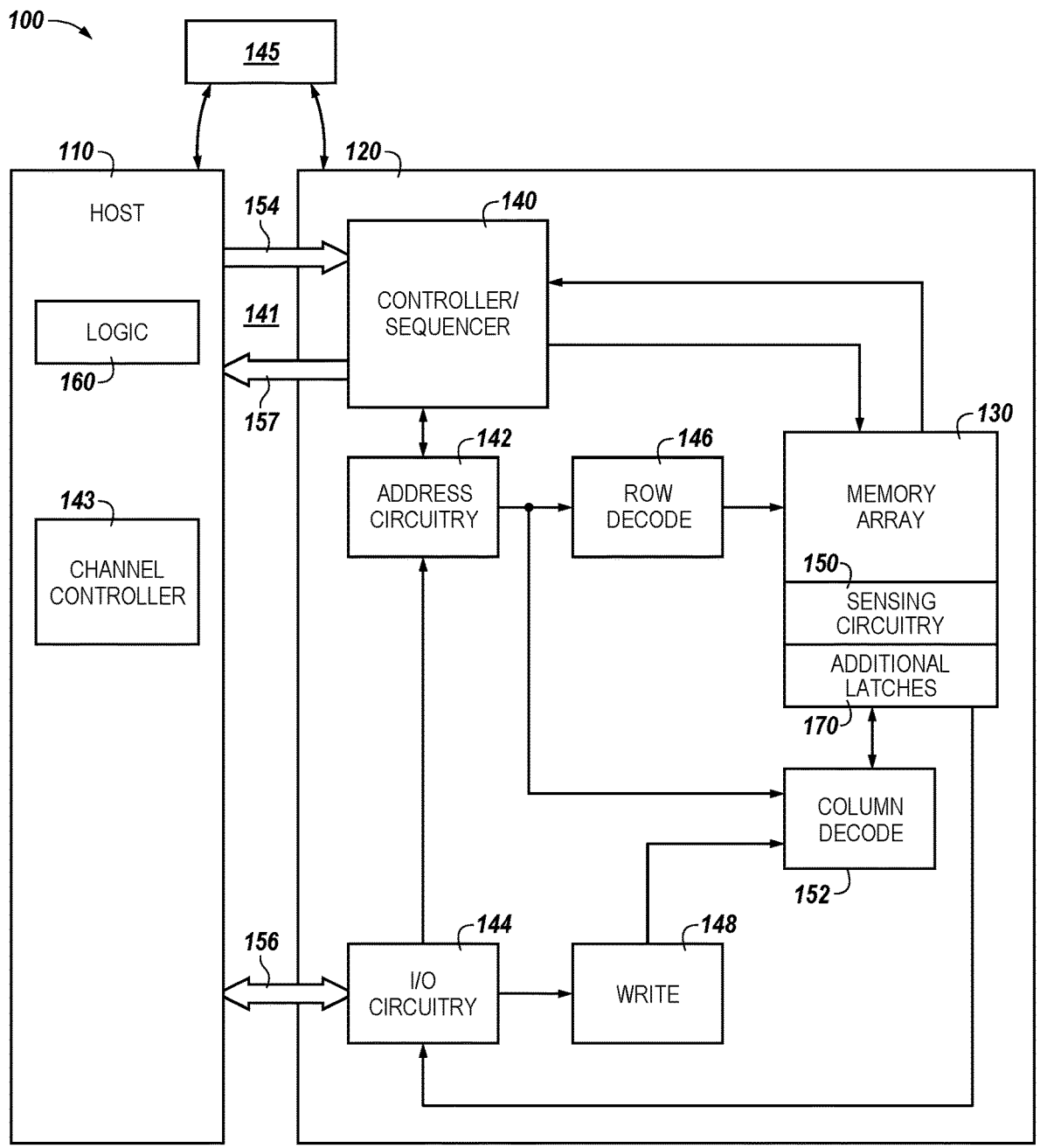
FIG. 1A is a block diagram of an apparatus in the form of a computing system including a memory device in accordance with a number of embodiments of the present disclosure.

The present disclosure includes apparatuses and methods to transfer data between banks of memory cells. An example includes a plurality of banks of memory cells and a controller coupled to the plurality of subarrays configured to cause transfer of data between the plurality of banks of memory cells via internal data path operations.

As described in more detail below, the embodiments can allow for data transfer between banks of memory cells on a data bus that is internal to a memory device. The data bus that is internal to a memory device, hereinafter referred to as "an internal data bus" can couple the memory cells together. The data transfer between banks of memory cells can occur on the internal data bus without using an external data bus. An external data bus can be used to transfer data between the banks of memory cells and other apparatuses external to the banks of memory cells, such as a host and/or another memory device, for example. The transfer of data between the banks of memory cells and other apparatuses external to the banks of memory cells can use a data path that includes the internal data bus and the external data bus. Embodiments of the present disclosure can allow for data transfer between banks of memory cells on an internal data bus without transferring data on an external data bus.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and structural changes may be made without departing from the scope of the present disclosure.

As used herein, designators such as "X", "Y", "N", "M", etc., particularly with respect to reference numerals in the drawings, indicate that a number of the particular feature so designated can be included. It is also to be understood that the terminology used herein is for the purpose of describing particular embodiments only, and is not intended to be limiting. As used herein, the singular forms "a", "an", and "the" can include both singular and plural referents, unless the context clearly dictates otherwise. In addition, "a number of", "at least one", and "one or more" (e.g., a number of memory arrays) can refer to one or more memory arrays, whereas a "plurality of" is intended to refer to more than one of such things. Furthermore, the words "can" and "may" are used throughout this application in a permissive sense (i.e., having the potential to, being able to), not in a mandatory sense (i.e., must). The term "include," and derivations thereof, means "including, but not limited to". The terms "coupled" and "coupling" mean to be directly or indirectly connected physically or for access to and movement (transmission) of commands and/or data, as appropriate to the context. The terms "data" and "data values" are used interchangeably herein and can have the same meaning, as appropriate to the context.

The figures herein follow a numbering convention in which the first digit or digits correspond to the figure number and the remaining digits identify an element or component in the figure. Similar elements or components between different figures may be identified by the use of similar digits. For example, 108 may reference element "08" in FIG. 1, and a similar element may be referenced as 208 in FIG. 2. As will be appreciated, elements shown in the various embodiments herein can be added, exchanged, and/or eliminated so as to provide a number of additional embodiments of the present disclosure. In addition, the proportion and/or the relative scale of the elements provided in the figures are intended to illustrate certain embodiments of the present disclosure and should not be taken in a limiting sense.

FIG. 1A is a block diagram of an apparatus in the form of a computing system 100 including a memory device 120 in accordance with a number of embodiments of the present disclosure. As used herein, a memory device 120, controller 140, channel controller 143, bank arbiter 145, high speed interface (HSI) 141, memory array 130, sensing circuitry 150, and/or a number of additional latches 170 might also be separately considered an "apparatus."

Figure 1B:
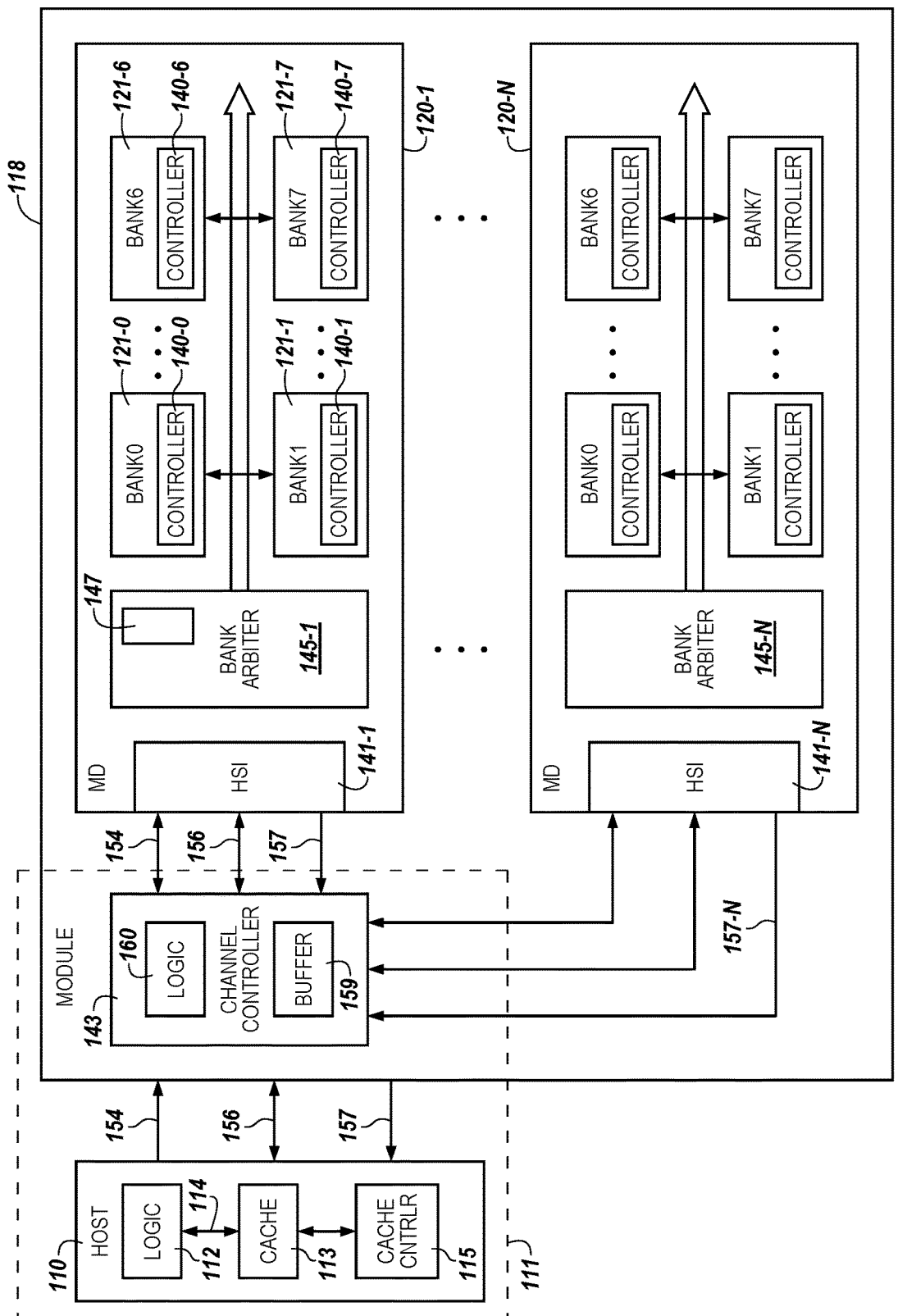
FIG. 1B is another block diagram of an apparatus in the form of a computing system including a memory device in accordance with a number of embodiments of the present disclosure.
Figure 1D:
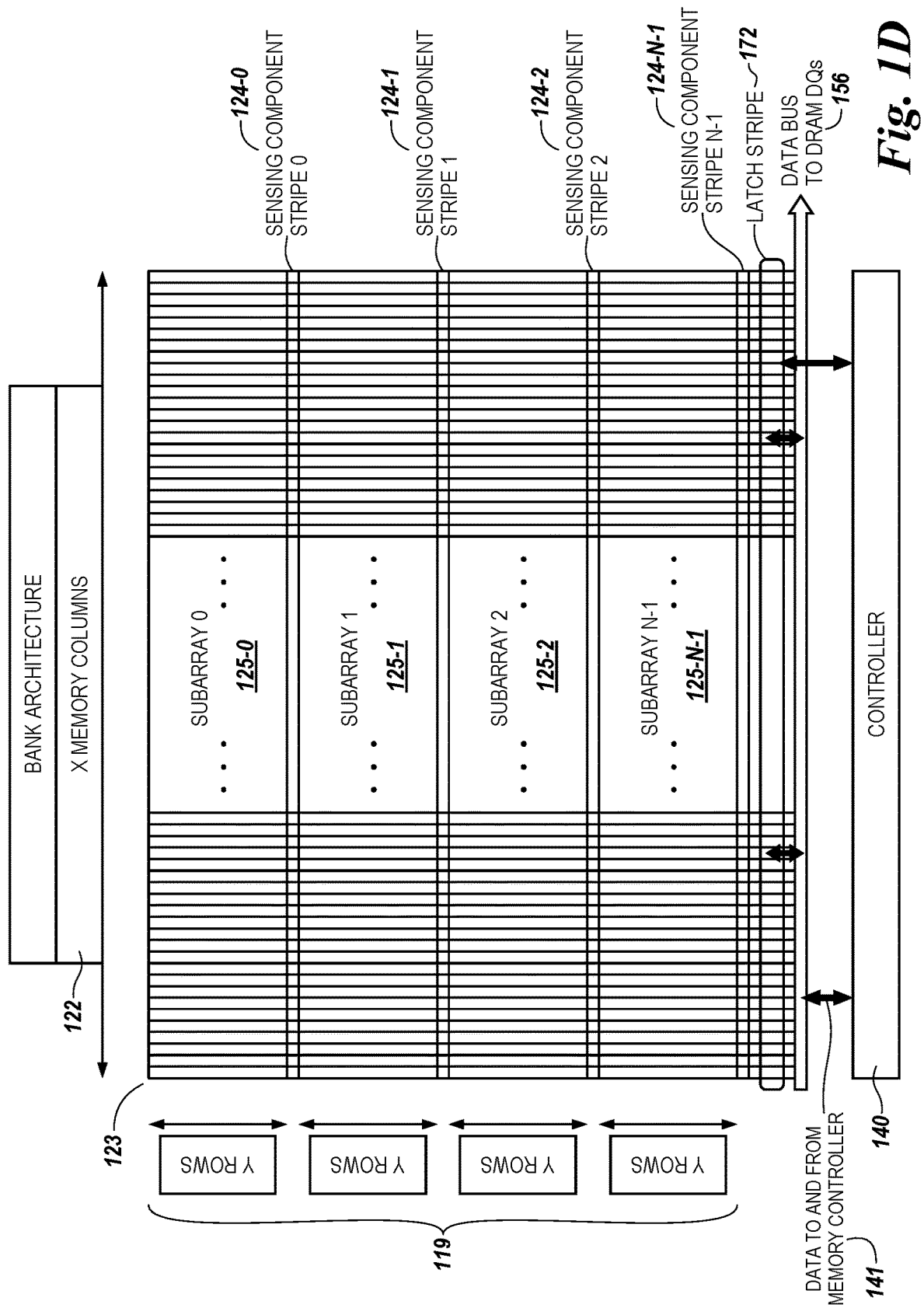
FIG. 1D is a block diagram of a bank section of a memory device in accordance with a number of embodiments of the present disclosure.
Figure 1E:
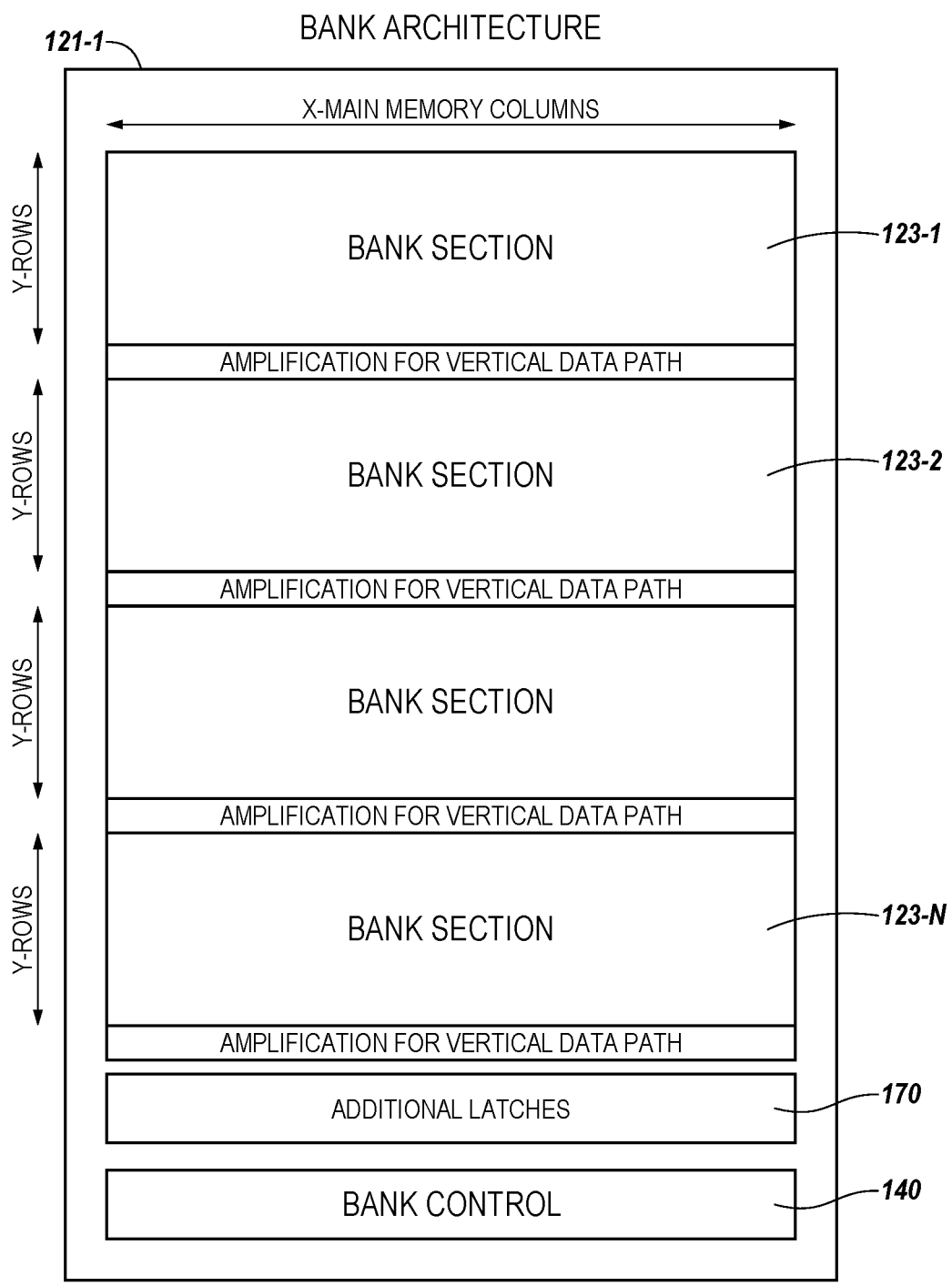
FIG. 1E is a block diagram of a number of bank sections of a memory device in accordance with a number of embodiments of the present disclosure.
Figure 2:
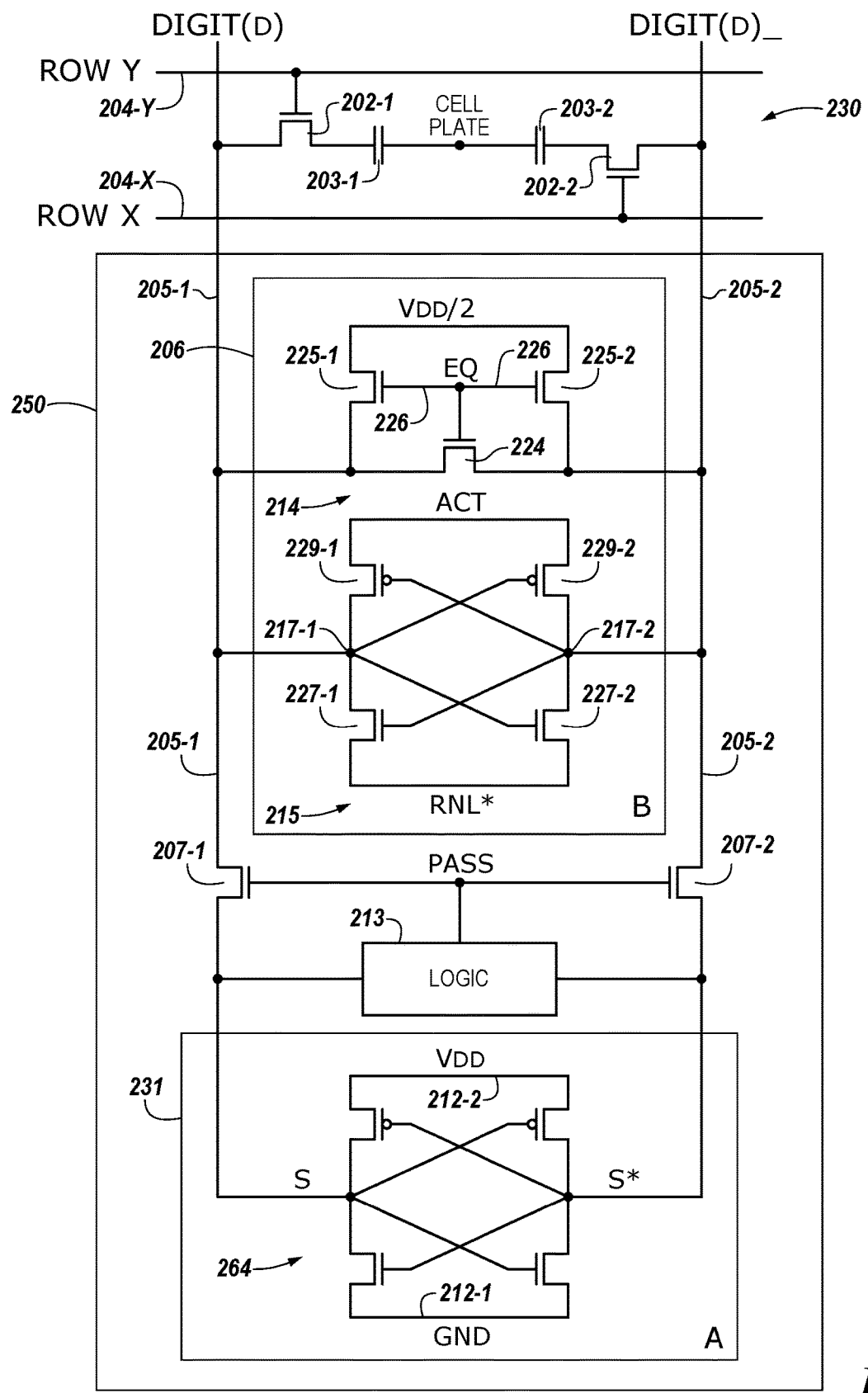
FIG. 2 is a schematic diagram illustrating sensing circuitry of a memory device in accordance with a number of embodiments of the present disclosure.
Figure 3:
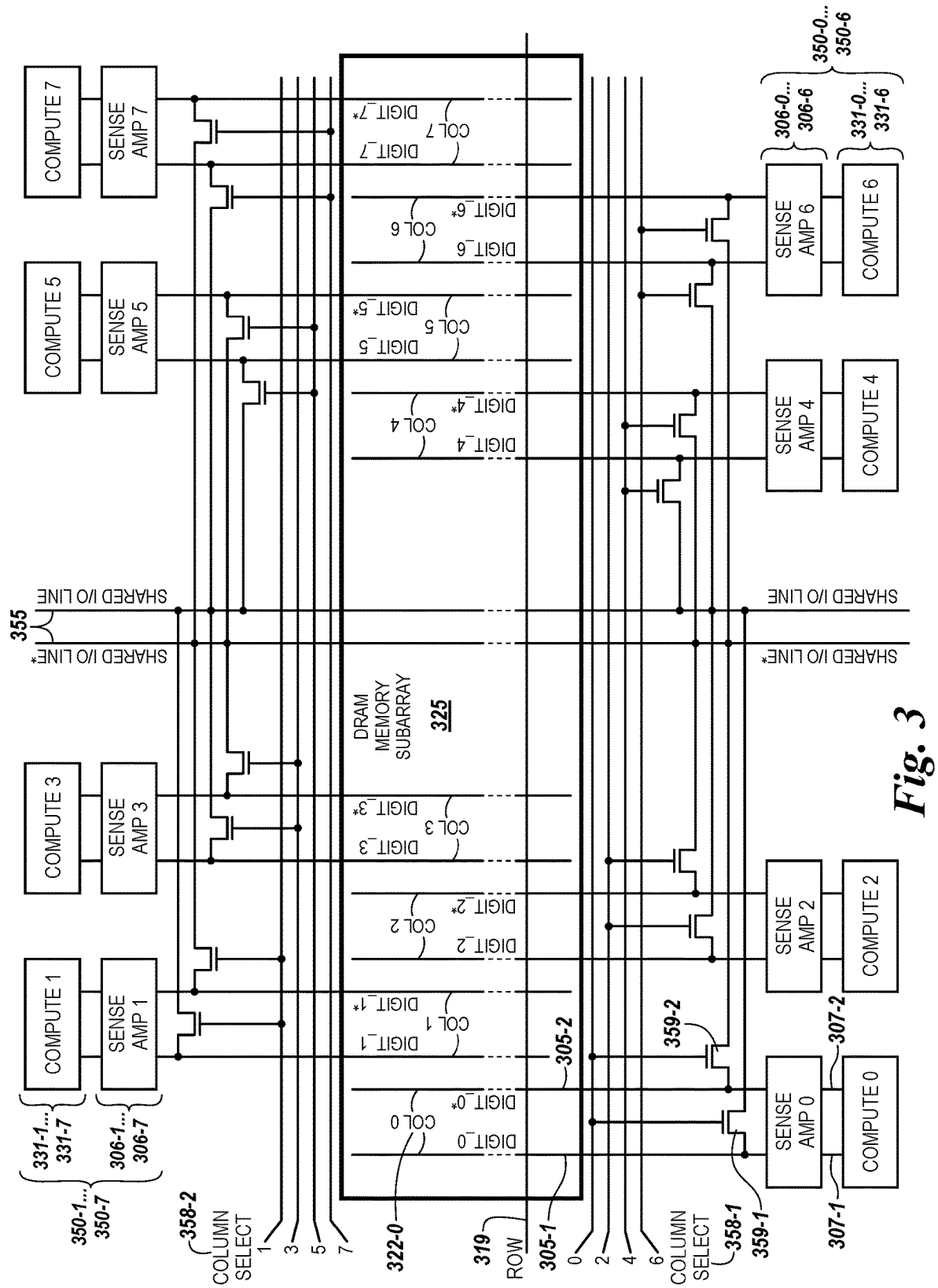
FIG. 3 is a schematic diagram illustrating circuitry for data transfer in a memory device in accordance with a number of embodiments of the present disclosure.

As used herein, the additional latches are intended to provide additional functionalities (e.g., peripheral amplifiers) that sense (e.g., read, store, cache) data values of memory cells in an array and that are distinct from the sense amplifiers of the sensing component stripes described herein (e.g., as shown at 206 in FIG. 2 and at corresponding reference number in FIG. 3). As such, the additional latches can be included in a "latch component 170". For example, latches of the latch component 170 can be located on a periphery of a bank 121 of the memory device, as shown for latch stripe 172 in FIG. 1D and latch component 170 in FIG. 1E. In contrast, the sense amplifiers located in a plurality of sensing component stripes 124 are physically associated with each subarray 125 of memory cells in the bank 121, as shown in FIGS. 1D and 1E.

System 100 in FIG. 1A includes the host 110 coupled (e.g., connected) to memory device 120, which includes a memory array 130. Host 110 can be a host system such as a personal laptop computer, a desktop computer, a digital camera, a smart phone, or a memory card reader, among various other types of hosts. Host 110 can include a system motherboard and/or backplane and can include a number of processing resources (e.g., one or more processors, microprocessors, or some other type of controlling circuitry). The system 100 can include separate integrated circuits or both the host 110 and the memory device 120 can be on the same integrated circuit. The system 100 can be, for instance, a server system and/or a high performance computing (HPC) system and/or a portion thereof. Although the examples shown in FIGS. 1A-1D illustrate a system having a Von Neumann architecture, embodiments of the present disclosure can be implemented in non-Von Neumann architectures, which may not include one or more components (e.g., CPU, ALU, etc.) often associated with a Von Neumann architecture.

For clarity, the system 100 has been simplified to focus on features with particular relevance to the present disclosure. The memory array 130 can be a DRAM array, SRAM array, STT RAM array, PCRAM array, TRAM array, RRAM array, NAND flash array, and/or NOR flash array, among other types of arrays. The array 130 can include memory cells arranged in rows coupled by access lines (which may be referred to herein as word lines or select lines) and columns coupled by sense lines (which may be referred to herein as data lines or digit lines). Although a single array 130 is shown in FIG. 1, embodiments are not so limited. For instance, memory device 120 may include a number of arrays 130 (e.g., a number of banks of DRAM cells, NAND flash cells, etc.).

The memory device 120 can include address circuitry 142 to latch address signals provided over a combined data/address bus 156 (e.g., an I/O bus connected to the host 110) by I/O circuitry 144 (e.g., provided to external ALU circuitry and/or to DRAM DQs via local I/O lines and global I/O lines). As used herein, DRAM DQs can enable input of data to and/or output of data from a bank (e.g., from and/or to the controller 140 and/or host 110) via a bus (e.g., data bus 156). During a write operation, a voltage (high=1, low=0) can be applied to a DQ (e.g., a pin). This voltage can be translated into an appropriate signal and stored in a selected memory cell. During a read operation, a data value read from a selected memory cell can appear at the DQ once access is complete and the output enable signal is asserted (e.g., by the output enable signal being low). At other times, DQs can be in a high impedance state, such that the DQs do not source or sink current and do not present a signal to the system. This also may reduce DQ contention when two or more devices (e.g., banks) share a combined data/address bus, as described herein.

Status and exception information can be provided from the controller 140 of the memory device 120 to a channel controller 143 (shown in FIG. 1B), for example, through a HSI out-of-band (OOB) bus 157, which in turn can be provided from the channel controller 143 to the host 110. The channel controller 143 can include a logic component 160 to allocate a plurality of locations (e.g., controllers for subarrays) in the arrays of each respective bank to store bank commands, application instructions (e.g., for sequences of operations), and arguments (PIM commands) for the various banks associated with operations of each of a plurality of memory devices (e.g., 120-1, . . . , 120-N as shown in FIG. 1B). The channel controller 143 can send commands (e.g., PIM commands) to the plurality of memory devices 120-1, . . . , 120-N to store those program instructions within a given bank of a memory device.

Address signals are received through address circuitry 142 and decoded by a row decoder 146 and a column decoder 152 to access the memory array 130. Data can be sensed (read) from memory array 130 by sensing voltage and/or current changes on sense lines (digit lines) using a number of sense amplifiers, as described herein, of the sensing circuitry 150. A sense amplifier can read and latch a page (e.g., a row) of data from the memory array 130. Additional compute circuitry, as described herein, can be coupled to the sensing circuitry 150 and can be used in combination with the sense amplifiers to sense, store (e.g., cache and/or buffer), perform compute functions (e.g., operations), and/or move data. The I/O circuitry 144 can be used for bi-directional data communication with host 110 over the data bus 156 (e.g., a 64 bit wide data bus). The write circuitry 148 can be used to write data to the memory array 130.

Controller 140 (e.g., bank control logic and sequencer) can decode signals (e.g., commands) provided by control bus 154 from the host 110. These signals can include chip enable signals, write enable signals, and/or address latch signals that can be used to control operations performed on the memory array 130, including data sense, data store, data movement (e.g., copying, transferring, and/or transporting data values), data write, and/or data erase operations, among other operations. In various embodiments, the controller 140 can be responsible for executing instructions from the host 110 and accessing the memory array 130. The controller 140 can be a state machine, a sequencer, or some other type of controller. The controller 140 can control shifting data (e.g., right or left) in a row of an array (e.g., memory array 130).

Examples of the sensing circuitry 150 are described further below (e.g., in FIGS. 2 and 3). For instance, in a number of embodiments, the sensing circuitry 150 can include a number of sense amplifiers and a number of compute components, which may serve as an accumulator and can be used to perform operations in each subarray (e.g., on data associated with complementary sense lines).

In a number of embodiments, the sensing circuitry 150 can be used to perform operations using data stored in memory array 130 as inputs and participate in movement of the data for copy, transfer, writing, logic, and/or storage operations to a different location in the memory array 130 without transferring the data via a sense line address access (e.g., without firing a column decode signal). As such, various compute functions can be performed using, and within, sensing circuitry 150 rather than (or in association with) being performed by processing resources external to the sensing circuitry 150 (e.g., by a processor associated with host 110 and/or other processing circuitry, such as ALU circuitry, located on device 120, such as on controller 140 or elsewhere).

In various previous approaches, data associated with an operand, for instance, would be read from memory via sensing circuitry and provided to external ALU circuitry via I/O lines (e.g., via local I/O lines and/or global I/O lines) and/or an external data bus (e.g., data bus 156 in FIG. 1B). The external ALU circuitry could include a number of registers and would perform compute functions using the operands, and the result would be transferred back to the array via the I/O lines. In contrast, in a number of embodiments of the present disclosure, sensing circuitry 150 is configured to perform operations on data stored in memory array 130 and store the result back to the memory array 130 without enabling an I/O line (e.g., a local I/O line) coupled to the sensing circuitry 150. In various embodiments, methods, and apparatuses are provided which can function as a PIM RAM. In PIM RAM operation it is useful to transfer data between banks without using a data bus external to the die. The sensing circuitry 150 can be formed on pitch with the memory cells of the array. The latch component 170 can include latches, as described herein, and can be coupled to the sensing circuitry 150 via a shared I/O line, but be distinct from the sensing circuitry 150. In various embodiments, methods and apparatuses are provided to achieve internal data movement using a minimum column to column delay (tCCD)

As such, in a number of embodiments, circuitry external to array 130 and sensing circuitry 150 is not needed to perform compute functions as the sensing circuitry 150 can perform the appropriate operations to perform such compute functions without the use of an external processing resource. Therefore, the sensing circuitry 150 may be used to complement or to replace, at least to some extent, such an external processing resource (or at least the bandwidth consumption of such an external processing resource).

However, in a number of embodiments, the sensing circuitry 150 may be used to perform operations (e.g., to execute instructions) in addition to operations performed by an external processing resource (e.g., host 110). For instance, host 110 and/or sensing circuitry 150 may be limited to performing only certain operations and/or a certain number of operations.

Enabling an I/O line can include enabling (e.g., turning on, activating) a transistor having a gate coupled to a decode signal (e.g., a column decode signal) and a source/drain coupled to the I/O line. However, embodiments are not limited to not enabling an I/O line. For instance, in a number of embodiments, the sensing circuitry (e.g., 150) can be used to perform operations without enabling column decode lines of the array; however, the local I/O line(s) may be enabled in order to transfer a result to a suitable location other than back to the array 130 (e.g., to an external register). Enabling (e.g., firing) a DQ pin can similarly consume significant power and time (e.g., require additional clock cycles (tck) for data transfers).

FIG. 1B is a block diagram of another apparatus architecture in the form of a computing system 100 including a plurality of memory devices 120-1, . . . , 120-N coupled to a host 110 via a channel controller 143 in accordance with a number of embodiments of the present disclosure. In at least one embodiment, the channel controller 143 may be coupled to and integrated with the plurality of banks of the memory device 120 and/or the channel controller 143 may be coupled to and integrated with the host 110. The channel controller 143 can be coupled to each of the plurality of banks of the memory device via an address and control (A/C) bus 154, which in turn can be coupled to the host 110. The channel controller 143 can also be coupled to each of the plurality of banks via a combined data/address bus 156, which in turn can be coupled to the host 110. In addition, the channel controller 143 can be coupled to each of the plurality of banks via an OOB bus 157 associated with the HSI 141, also referred to herein as a status channel interface, which is configured to report status, exception and other data information to the channel controller 143 to exchange with the host 110.

The channel controller 143 can receive the status and exception information from the HSI 141 associated with a bank arbiter 145 associated with each of the plurality of banks. The bank arbiter 145 can sequence and control data movement within the plurality of banks (e.g., Bank zero (0), Bank one (1), . . . , Bank six (6), Bank seven (7), etc., as shown in FIG. 1B). A controller 140 can be associated with each particular bank (e.g., Bank 0, . . . , Bank 7) in a given memory device 120 and can decode signals provided by control bus 154 from the host 110. Each of the plurality of banks can include the controller 140 and other components, including an array of memory cells 130 and sensing circuitry 150, and/or latch component 170, etc.

For example, each of the plurality of banks (e.g., in a plurality of memory devices 120-1, 120-2, . . . , 120-N each having a plurality of banks as shown in FIG. 1B) can include address circuitry 142 to latch address signals provided over a portion of a combined data/address bus 156 (e.g., an I/O bus) through I/O circuitry 144. Status and/or exception information can be provided from the controller 140 associated with (e.g., on pitch and/or on chip with) each bank to the channel controller 143, using the OOB bus 157, which in turn can be provided from the plurality of banks to the host 110. For each of the plurality of banks (e.g., Bank 0, . . . , Bank 7) address signals can be received through address circuitry 142 and decoded by a row decoder 146 and a column decoder 152 to access the memory array 130. Data can be read from memory array 130 by sensing voltage and/or current changes on the sense lines using sensing circuitry 150. The sensing circuitry 150 can read and latch a page (e.g., row) of data from the memory array 130. The I/O circuitry 144 can be used for bi-directional data communication with host 110 over the data bus 156. The write circuitry 148 is used to write data to the memory array 130 and the OOB bus 157 can be used to report status and/or exception information to the channel controller 143.

In some embodiments, the channel controller 143 can send commands to the plurality of banks (e.g., Bank 0, . . . , Bank 7) and field return results and/or data from such operations. As described herein, the return results and/or data can be returned to the channel controller 143 via the OOB bus 157 associated with the status channel interface on each of the plurality of banks.

As shown in FIG. 1B, the channel controller 143 can receive the status and/or exception information from a HSI 141 (also referred to herein as a status channel interface) associated with a bank arbiter 145 in each of the plurality of memory devices 120-1, . . . , 120-N. In the example of FIG. 1B, each of the plurality of memory devices 120-1, . . . , 120-N can include a bank arbiter 145 to sequence control and data with a plurality of banks (e.g., Bank 0, . . . , Bank 7, etc.). Each of the plurality of banks can include a controller 140 and other components, including an array of memory cells 130 and sensing circuitry 150, logic circuitry 170, etc., as described in connection with FIG. 1A.

The channel controller 143 can include one or more local buffers 159 to store program instructions and can include logic 160 to allocate a plurality of locations (e.g., subarrays or portions of subarrays) in the arrays of each respective bank to store bank commands, and arguments (e.g., PIM commands) for the various banks associated with operation of each of the plurality of memory devices 120-1, . . . , 120-N. The channel controller 143 can send commands (e.g., PIM commands) to the plurality of memory devices 120-1, . . . , 120-N to store those program instructions within a given bank of a memory device. These program instructions and PIM commands may need to be moved in a bank to bank data transfer (BBT) within a memory device.

As in FIG. 1A, a controller 140 (e.g., bank control logic and/or sequencer) associated with any subarray in a particular bank (e.g., Bank 0, . . . , Bank 7, etc.) in a given memory device (e.g., 120-1, . . . , 120-N) can decode signals provided by control bus 154 from the host 110. These signals can include chip enable signals, write enable signals, and/or address latch signals that are used to control operations performed on the memory array 130, including data read, data write, data copy, data movement, and/or data erase operations. In various embodiments, the controller 140 is responsible for executing instructions from the host 110.

Figure 1C:
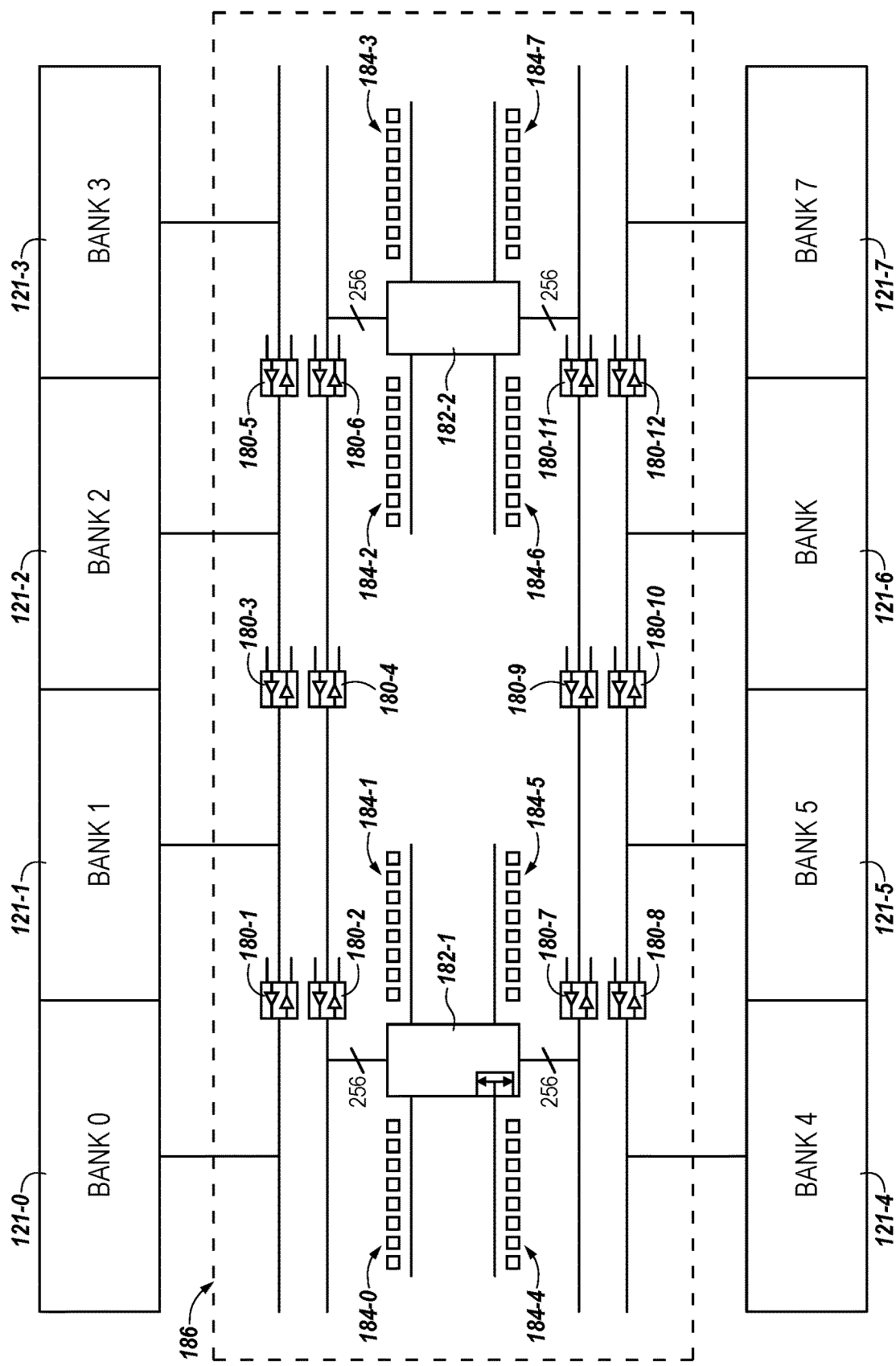
FIG. 1C is a block diagram of a number of banks of a memory device in accordance with a number of embodiments of the present disclosure.

FIG. 1C is a block diagram of a number of banks of a memory device in accordance with a number of embodiments of the present disclosure. In FIG. 1C, banks 121-0, . . . , 121-7 are coupled together via internal data bus 186. Internal data bus 186 can include a number of data paths that allow for data transfer between banks 121-0, . . . , 121-7. Internal data bus 186 can include a number of buffers (e.g., a number of bidirectional buffers 180-1, . . . , 180-T) for managing data transfers between banks 121-0, . . . , 121-7 and a number of data multiplexer (mux) buffers 182-1 and 182-2 for temporarily storing data as it is transferred between banks 121-0, . . . , 121-7). Internal data bus 186 can be coupled to an external data bus (e.g. data bus 156 in FIG. 1B) and/or a shared I/O line (e.g., shared I/O line 355 in FIG. 3) via a number of DQs 184-0, . . . , 184-7. In various embodiments, data can be transferred between banks 121-0, . . . , 121-7 via internal data bus 186. Previously data could be transferred on an external data bus from banks 121-0, . . . , 121-7 to other apparatuses external to banks 121-0, . . . , 121-7 via the number of DQs 184-0, . . . , 184-7. Thus, in a number of embodiments, data can be transferred between banks 121-0, . . . , 121-7 without operation the number of DQs 184-0, . . . , 184-7.

Data can be transferred via internal data bus 186 by performing internal data path operations that include a bank to bank data transfer command that is sent to the banks 121-0, . . . , 121-7 from the channel controller. The bank to bank data transfer command can include source bank information and destination bank information. The source bank information and destination bank information can be included on any of the address bits of a command. For example, the source bank information can be included in a first number of bits, such as bank address bits (e.g., BA<2:0>) of the command, and the destination bank information can be included in a second number of bits, such as column address bits (e.g., CA<2:0>) of the command. Also, a number of additional address pins can be added allowing the source bank information and/or the destination bank information to be included in address bits on the additional address pins. In various embodiments, the bank to bank data transfer commands can be sent from the channel controller to banks 121-0, . . . , 121-7 with reduced latency as compared to performing a silent read command followed by a silent write command. The reduced latency with performing the bank to bank data transfer commands can be associated with knowing the source bank and the destination bank when the command is issued. For example, a bank to bank data transfer command can be performed every 4 clock cycles when performing a number of bank to bank data transfers from a same source bank because the bank to bank data transfer commands do not have latency or burst length delays caused by firing the number of DQs 184-0, . . . , 184-7. The latency associated with performing a number of bank to bank data transfers from a same source bank can be 4 clock cycles because the bank to bank data transfer command latency is due to time for write to read (tWTR) delay and does not include read latency.

In various embodiments, data can be transferred between banks 121-0, ..., 121-7 via internal data bus 186 by performing a silent read command followed by a silent write command. A silent read command can cause data to be transferred from one of the banks 121-0, ..., 121-7 (e.g., a source bank) via internal data bus 186 to one of the data mux 182-1 and 182-2 and/or a number of bidirectional buffers 180-1, ..., 180-T. The silent read command can include performing a read operation from a bank that is shunted from providing the data to the DQs 184-0, ..., 184-7. The silent read operation can be performed without firing the DQs 184-0, ..., 184-7. The silent read command transfers data only on internal data bus 186 and not on data paths external to internal data bus 186. The silent write command can be performed following the silent read command to transfer the data stored in one of the data mux 182-1 and 182-2 and/or a number of bidirectional buffers 180-1, ..., 180-T to one of the banks 121-0, ..., 121-7 (e.g., a destination bank). The silent write command can be performed without firing the DQs 184-0, ..., 184-7. The silent write command transfers data only on internal data bus 186 and not on data paths external to internal data bus 186. The silent write command that follows the silent read command can be performed with reduced latency by redefining the silent write commands to bypass the write latency. The column select can be fired during the silent write command similarly to filing the column select during the silent read command. For example, the silent read to silent write command delay can be 4 clock cycles and the silent write to silent read command delay can be 4 clock cycles resulting in a silent read command being performed every 8 clock cycles. The reduced latency when performing a silent read command and silent write command sequence can include a silent read to silent write command delay and a silent write to silent read command delay and can be due to a reduction in latency due to the DQs not being fired during performance of the silent read command.

FIG. 1D is a block diagram of a bank section 123 of a memory device in accordance with a number of embodiments of the present disclosure. For example, bank section 123 can represent an example section of a number of bank sections of a memory device. As shown in FIG. 1D, a bank section 123 can include a plurality of memory columns 122 shown horizontally as X (e.g., 4096, 8192, or 16,384 columns, among various possibilities, in an example DRAM bank and bank section). Additionally, the bank section 123 may be divided into subarray 0, subarray 1, ..., and subarray N−1 (e.g., 32, 64, or 128 subarrays, among various possibilities) shown at 125-0, 125-1, ..., 125-N−1, respectively, that are separated by amplification regions configured to be coupled to a data path. As such, the subarrays 125-0, 125-1, ..., 125-N−1 can each have amplification regions 124-0, 124-1, ..., 124-N−1 that correspond to sensing component stripe 0, sensing component stripe 1, ..., and sensing component stripe N−1, respectively.

Each column 122 is configured to be coupled to sensing circuitry 150, as described in connection with FIG. 1A and elsewhere herein. As such, each column in a subarray can be coupled individually to a sense amplifier that contributes to a sensing component stripe for that subarray. For example, as shown in FIG. 1D, the bank section 123 can include sensing component stripe 0, sensing component stripe 1, ..., sensing component stripe N−1 that each have sensing circuitry 150 with sense amplifiers that can, in various embodiments, be used as registers, cache and/or data buffering and that are coupled to each column 122 in the subarrays 125-0, 125-1, ..., 125-N−1.

Each of the of the subarrays 125-0, 125-1, ..., 125-N−1 can include a plurality of rows 119 shown vertically as Y (e.g., each subarray may include 256, 512, 1024 rows, among various possibilities, in an example DRAM bank). Example embodiments are not limited to the example horizontal and vertical orientation of columns and rows described herein or the example numbers thereof.

The latch component 170 associated with the sensing circuitry 150 coupled to the memory array 130, as shown in FIG. 1A, can complement and can be connected (e.g., selectably coupled) to the controller 140. The sense amplifiers that sense data values in memory cells of the subarrays are located in a plurality of sensing component stripes 124 that are each physically associated with a subarray 125 of memory cells in the bank section 123 shown in FIG. 1D.

In contrast, the latch component 170 is configured to receive moved data values, store the moved data values, and/or enable access to and further movement of the data values (e.g., by and/or to the controller 140 and/or the host 110) from the bank section 123 includes a plurality of latches located in a number of latch stripes 172 (e.g., 1-8 latch stripes, among other possibilities, as described herein) on a periphery of the bank section 123. The plurality of latches can each be configured with a store (cache) for data values. For example, the data values (e.g., some or all of the data values in a row) can be moved from a row 119 in response to access of the row during a read and/or write operation. Each column 122 can be configured to be coupled to latches in the latch stripe 172 (e.g., via a plurality of shared I/O lines, as described herein). As such, each column in the bank can be coupled individually to a latch that contributes to a latch stripe 172 for that bank. Each bank 121-0, ..., 121-7 of the memory array 130 can be configured to include at least one of its own latch stripes 172.

As shown in FIG. 1D, the bank section 123 can be associated with controller 140. The controller 140 shown in FIG. 1D can, in various examples, represent at least a portion of the functionality embodied by and contained in the controllers 140 shown in FIGS. 1A and 1B. The controller 140 can direct (e.g., control) input of commands and data 141 to the section 123 and output (e.g., movement) of data from the bank section 123 to another bank, along with control of data movement in the section 123, as described herein. The bank section 123 can include an internal data bus (e.g., a 64 bit wide data bus) that can also be connected to DRAM DQs, which can correspond to the internal data bus 186 described in connection with FIG. 1C. Internal data bus 186 for each bank (e.g., 121-0, ..., 121-7) of subarrays (e.g., 125-0, 125-1, ..., 125-N−1) can be referred to as a portion of a data bus that contributes to formation of a combined data bus (e.g., as described in connection with FIG. 1B for a plurality of banks and/or memory devices). As such, in some embodiments, eight 64 bit wide data bus portions for eight banks can contribute to a 512 bit wide combined data bus.

FIG. 1E is a block diagram of a number of bank sections 123-1, ..., 123-N of a memory device in accordance with a number of embodiments of the present disclosure. For example, bank 121-1 can represent an example bank of a memory device 120, such as Bank 0, ..., Bank 7 (121-0, ..., 121-7) described in connection with FIG. 1B. As shown in FIG. 1E, a bank 121-1 can include a plurality of main memory columns (shown horizontally as X) (e.g., 16,384 columns in an example DRAM bank). Additionally, the bank 121-1 may be divided up into bank sections (e.g., of subarrays), 123-1, 123-2, . . . , 123-N, separated by amplification regions for a data path (e.g., amplification regions 124-0, 124-1, . . . , 124-N–1 that correspond to sensing component stripe 0, sensing component stripe 1, . . . , and sensing component stripe N–1 in FIG. 1C). Each of the of the bank sections 123-1, . . . , 123-N can include a plurality of rows (shown vertically as Y) (e.g., each section may include 16 subarrays that each may include 256, 512, or 1024 rows in an example DRAM bank). The bank section 123-1 can include an internal data bus (e.g., a 64 bit wide data bus) that can also be connected to DRAM DQs, which can correspond to the internal data bus 186 described in connection with FIG. 1C. Example embodiments are not limited to the example horizontal and/or vertical orientation of columns and rows described here or the example numbers thereof.

As shown in FIG. 1E, the bank 121-1 can include a latch component 170, including latches that each can operate as a cache for data values, and that is coupled to the bank sections 123-1, . . . , 123-N. The latch component 170 can represent another example of the latch component 170 selectably coupled to the sensing circuitry 150 coupled to the memory array 130 (e.g., a bank thereof) and the controller 140 shown in FIG. 1A and/or the latch stripe 172 associated with the subarrays 125-0, 125-1, . . . , 125-N–1 and the controller 140 shown in FIG. 1D. Further, as shown in FIG. 1E, the bank 121-1 can be associated with bank control (e.g., controller 140). The bank control shown in FIG. 1E can, for example, represent at least a portion of the functionality embodied by and contained in the controller 140.

FIG. 2 is a schematic diagram illustrating sensing circuitry 250 in accordance with a number of embodiments of the present disclosure. The sensing circuitry 250 can correspond to sensing circuitry 150 shown in FIG. 1A.

A memory cell can include a storage element (e.g., capacitor) and an access device (e.g., transistor). For instance, a first memory cell can include transistor 202-1 and capacitor 203-1, and a second memory cell can include transistor 202-2 and capacitor 203-2, etc. In this embodiment, the memory array 230 is a DRAM array of 1T1C (one transistor one capacitor) memory cells, although other embodiments of configurations can be used (e.g., 2T2C with two transistors and two capacitors per memory cell). In a number of embodiments, the memory cells may be destructive read memory cells (e.g., reading the data stored in the cell destroys the data such that the data originally stored in the cell is refreshed after being read).

The cells of the memory array 230 can be arranged in rows coupled by access (word) lines 204-X (Row X), 204-Y (Row Y), etc., and columns coupled by pairs of complementary sense lines (e.g., digit lines DIGIT(D) and DIGIT (D) shown in FIG. 2 and DIGIT_0 and DIGIT_0* shown in FIG. 3). The individual sense lines corresponding to each pair of complementary sense lines can also be referred to as digit lines 205-1 for DIGIT (D) and 205-2 for DIGIT (D)_, respectively, or corresponding reference numbers in FIG. 3. Although only one pair of complementary digit lines are shown in FIG. 2, embodiments of the present disclosure are not so limited, and an array of memory cells can include additional columns of memory cells and digit lines (e.g., 4,096, 8,192, 16,384, etc.).

Although rows and columns are illustrated as orthogonally oriented in a plane, embodiments are not so limited. For example, the rows and columns may be oriented relative to each other in any feasible three-dimensional configuration. For example, the rows and columns may be oriented at any angle relative to each other, may be oriented in a substantially horizontal plane or a substantially vertical plane, and/or may be oriented in a folded topology, among other possible three-dimensional configurations.

Memory cells can be coupled to different digit lines and word lines. For example, a first source/drain region of a transistor 202-1 can be coupled to digit line 205-1 (D), a second source/drain region of transistor 202-1 can be coupled to capacitor 203-1, and a gate of a transistor 202-1 can be coupled to word line 204-Y. A first source/drain region of a transistor 202-2 can be coupled to digit line 205-2 (D)_, a second source/drain region of transistor 202-2 can be coupled to capacitor 203-2, and a gate of a transistor 202-2 can be coupled to word line 204-X. A cell plate, as shown in FIG. 2, can be coupled to each of capacitors 203-1 and 203-2. The cell plate can be a common node to which a reference voltage (e.g., ground) can be applied in various memory array configurations.

The memory array 230 is configured to couple to sensing circuitry 250 in accordance with a number of embodiments of the present disclosure. In this embodiment, the sensing circuitry 250 comprises a sense amplifier 206 and a compute component 231 corresponding to respective columns of memory cells (e.g., coupled to respective pairs of complementary digit lines). The sense amplifier 206 can be coupled to the pair of complementary digit lines 205-1 and 205-2. The compute component 231 can be coupled to the sense amplifier 206 via pass gates 207-1 and 207-2. The gates of the pass gates 207-1 and 207-2 can be coupled to operation selection logic 213.

The operation selection logic 213 can be configured to include pass gate logic for controlling pass gates that couple the pair of complementary digit lines un-transposed between the sense amplifier 206 and the compute component 231 and swap gate logic for controlling swap gates that couple the pair of complementary digit lines transposed between the sense amplifier 206 and the compute component 231. The operation selection logic 213 can also be coupled to the pair of complementary digit lines 205-1 and 205-2. The operation selection logic 213 can be configured to control continuity of pass gates 207-1 and 207-2 based on a selected operation.

The sense amplifier 206 can be operated to determine a data value (e.g., logic state) stored in a selected memory cell. The sense amplifier 206 can comprise a cross coupled latch, which can be referred to herein as a primary latch. In the example illustrated in FIG. 2, the circuitry corresponding to sense amplifier 206 comprises a latch 215 including four transistors coupled to a pair of complementary digit lines D 205-1 and (D)_205-2. However, embodiments are not limited to this example. The latch 215 can be a cross coupled latch (e.g., gates of a pair of transistors) such as n-channel transistors (e.g., NMOS transistors) 227-1 and 227-2 are cross coupled with the gates of another pair of transistors, such as p-channel transistors (e.g., PMOS transistors) 229-1 and 229-2).

In operation, when a memory cell is being sensed (e.g., read), the voltage on one of the digit lines 205-1 (D) or 205-2 (D)_ will be slightly greater than the voltage on the other one of digit lines 205-1 (D) or 205-2 (D)_. An ACT signal and an RNL* signal can be driven low to enable (e.g., fire) the sense amplifier 206. The digit lines 205-1 (D) or 205-2 (D)_ having the lower voltage will turn on one of the PMOS transistor 229-1 or 229-2 to a greater extent than the other of PMOS transistor 229-1 or 229-2, thereby driving high the digit line 205-1 (D) or 205-2 (D)_ having the higher voltage to a greater extent than the other digit line 205-1 (D) or 205-2 (D)_ is driven high.

Similarly, the digit line 205-1 (D) or 205-2 (D)_ having the higher voltage will turn on one of the NMOS transistor 227-1 or 227-2 to a greater extent than the other of the NMOS transistor 227-1 or 227-2, thereby driving low the digit line 205-1 (D) or 205-2 (D)_ having the lower voltage to a greater extent than the other digit line 205-1 (D) or 205-2 (D)_ is driven low. As a result, after a short delay, the digit line 205-1 (D) or 205-2 (D)_ having the slightly greater voltage is driven to the voltage of the supply voltage $V_{cc}$ through a source transistor, and the other digit line 205-1 (D) or 205-2 (D)_ is driven to the voltage of the reference voltage (e.g., ground) through a sink transistor. Therefore, the cross coupled NMOS transistors 227-1 and 227-2 and PMOS transistors 229-1 and 229-2 serve as a sense amplifier pair, which amplify the differential voltage on the digit lines 205-1 (D) and 205-2 (D)_ and operate to latch a data value sensed from the selected memory cell.

Embodiments are not limited to the sense amplifier 206 configuration illustrated in FIG. 2. As an example, the sense amplifier 206 can be a current-mode sense amplifier and a single-ended sense amplifier (e.g., sense amplifier coupled to one digit line). Also, embodiments of the present disclosure are not limited to a folded digit line architecture such as that shown in FIG. 2.

The sense amplifier 206 can, in conjunction with the compute component 231, be operated to perform various operations using data from an array as input. In a number of embodiments, the result of an operation can be stored back to the array without transferring the data via a digit line address access and/or moved between banks without using an external data bus (e.g., without firing a column decode signal such that data is transferred to circuitry external from the array and sensing circuitry via local I/O lines). As such, a number of embodiments of the present disclosure can enable performing operations and compute functions associated therewith using less power than various previous approaches. Additionally, since a number of embodiments eliminate the need to transfer data across local and global I/O lines and/or external data buses in order to perform compute functions (e.g., between memory and discrete processor), a number of embodiments can enable an increased (e.g., faster) processing capability as compared to previous approaches.

The sense amplifier 206 can further include equilibration circuitry 214, which can be configured to equilibrate the digit lines 205-1 (D) and 205-2 (D)_. In this example, the equilibration circuitry 214 comprises a transistor 224 coupled between digit lines 205-1 (D) and 205-2 (D)_. The equilibration circuitry 214 also comprises transistors 225-1 and 225-2 each having a first source/drain region coupled to an equilibration voltage (e.g., $V_{DD}/2$), where $V_{DD}$ is a supply voltage associated with the array. A second source/drain region of transistor 225-1 can be coupled digit line 205-1 (D), and a second source/drain region of transistor 225-2 can be coupled digit line 205-2 (D)_. Gates of transistors 224, 225-1, and 225-2 can be coupled together, and to an equilibration (EQ) control signal line 226. As such, activating EQ enables the transistors 224, 225-1, and 225-2, which effectively shorts digit lines 205-1 (D) and 205-2 (D)_ together and to the equilibration voltage (e.g., $V_{DD}/2$).

Although FIG. 2 shows sense amplifier 206 comprising the equilibration circuitry 214, embodiments are not so limited, and the equilibration circuitry 214 may be implemented discretely from the sense amplifier 206, implemented in a different configuration than that shown in FIG. 2, or not implemented at all.

As described further below, in a number of embodiments, the sensing circuitry 250 (e.g., sense amplifier 206 and compute component 231) can be operated to perform a selected operation and initially store the result in one of the sense amplifier 206 or the compute component 231 without transferring data from the sensing circuitry via a local or global I/O line and/or moved between banks without using an external data bus (e.g., without performing a sense line address access via activation of a column decode signal, for instance).

Performance of operations (e.g., Boolean logical operations involving data values) is fundamental and commonly used. Boolean logical operations are used in many higher level operations. Consequently, speed and/or power efficiencies that can be realized with improved operations, can translate into speed and/or power efficiencies of higher order functionalities.

As shown in FIG. 2, the compute component 231 can also comprise a latch, which can be referred to herein as a secondary latch 264. The secondary latch 264 can be configured and operated in a manner similar to that described above with respect to the primary latch 215, with the exception that the pair of cross coupled p-channel transistors (e.g., PMOS transistors) included in the secondary latch can have their respective sources coupled to a supply voltage (e.g., $V_{DD}$), and the pair of cross coupled n-channel transistors (e.g., NMOS transistors) of the secondary latch can have their respective sources selectively coupled to a reference voltage (e.g., ground), such that the secondary latch is continuously enabled. The configuration of the compute component 231 is not limited to that shown in FIG. 2, and various other embodiments are feasible.

As described herein, a memory device (e.g., 120 in FIG. 1A) can be configured to couple to a host (e.g., 110) via a data bus (e.g., 156) and a control bus (e.g., 154). A bank 121 in the memory device (e.g., bank section 123 in FIG. 1C) can include a plurality of subarrays (e.g., 125-0, 125-1, . . . , 125-N−1 in FIG. 1C) of memory cells. The bank 121 can include sensing circuitry (e.g., 150 in FIG. 1A and corresponding reference numbers in FIGS. 2 and 3) coupled to the plurality of subarrays via a plurality of columns (e.g., 122 in FIG. 1C) of the memory cells. The sensing circuitry can include a sense amplifier and a compute component (e.g., 206 and 231, respectively, in FIG. 2) coupled to each of the columns.

The bank 121 can include a plurality of sensing component stripes (e.g., 124-0, 124-1, . . . , 124-N−1 in FIG. 1C) each with sensing circuitry coupled to a respective subarray of the plurality of the subarrays. A controller (e.g., 140 in FIGS. 1A-1C) coupled to the bank can be configured to direct, as described herein, movement of data values stored in a first subarray (e.g., from data values in a row of the subarray sensed (cached) by the coupled sensing component stripe) to be stored in latches of a latch stripe (e.g., 172 in FIG. 1C) and/or a latch component (e.g., 170 in FIG. 1D). Moving (e.g., copying, transferring, and/or transporting) data values between sense amplifiers and/or compute components (e.g., 206 and 231, respectively, in FIG. 2) in a sensing component stripe and corresponding sense amplifiers and/or compute components that form latches in a latch stripe can be enabled by a number of selectably coupled shared I/O lines (e.g., 355 in FIG. 3) shared by the sensing component stripe and the latch stripe, as described herein.

The memory device can include a sensing component stripe (e.g., 124 in FIG. 1C) configured to include a number of a plurality of sense amplifiers and compute components (e.g., 306-0, 306-1, . . . , 306-7 and 331-0, 331-1, . . . , 331-7, respectively, as shown in FIG. 3) that can correspond to a number of the plurality of columns (e.g., 122 in FIG. 1C and 305-1 and 305-2 in FIG. 3) of the memory cells, where the number of sense amplifiers and/or compute components can be selectably coupled to the plurality of shared I/O lines (e.g., via column select circuitry 358-1 and 358-2). The column select circuitry can be configured to selectably sense data in a particular column of memory cells of a subarray by being selectably coupled to a plurality of (e.g., four, eight, and sixteen, among other possibilities) sense amplifiers and/or compute components.

In some embodiments, a number of a plurality of sensing component stripes (e.g., 124-0, . . . , 124-N−1 in FIG. 1C) in the bank can correspond to a number of the plurality of subarrays (e.g., 125-0, 125-1, . . . , 125-N−1 in FIG. 1C) in the bank. A sensing component stripe can include a number of sense amplifiers and/or compute components configured to move (e.g., copy, transfer, and/or transport) an amount of data sensed from a row of the first subarray in parallel to a plurality of shared I/O lines. In some embodiments, the amount of data can correspond to at least a thousand bit width of the plurality of shared I/O lines.

As described herein, the array of memory cells can include an implementation of DRAM memory cells where the controller is configured, in response to a command, to move (e.g., copy, transfer, and/or transport) data from the source location to the destination location via a shared I/O line. In various embodiments, the source location can be in a first bank and the destination location can be in a second bank in the memory device and/or the source location can be in a first subarray of one bank in the memory device and the destination location can be in a second subarray of a different bank. According to embodiments, the data can be moved as described in connection with FIG. 1C. The first subarray and the second subarray can be in the same section of the bank or the subarrays can be in different sections of the bank.

As described herein, the apparatus can be configured to move (e.g., copy, transfer, and/or transport) data from a source location, including a particular row (e.g., 319 in FIG. 3) and column address associated with a first number of sense amplifiers and compute components) to a shared I/O line. In addition, the apparatus can be configured to move the data to a destination location, including a particular row and column address associated with a second number of sense amplifiers and compute components. As the reader will appreciate, each shared I/O line can actually include a complementary pair of shared I/O lines (e.g., shared I/O line and shared I/O line* as shown in the example configuration of FIG. 3). In some embodiments described herein, 2048 shared I/O lines (e.g., complementary pairs of shared I/O lines) can be configured as a 2048 bit wide shared I/O line.

FIG. 3 is a schematic diagram illustrating circuitry for data transfer in a memory device in accordance with a number of embodiments of the present disclosure. FIG. 3 shows eight sense amplifiers (e.g., sense amplifiers 0, 1, . . . , 7 shown at 306-0, 306-1, . . . , 306-7, respectively) each coupled to a respective pair of complementary sense lines (e.g., digit lines 305-1 and 305-2). FIG. 3 also shows eight compute components (e.g., compute components 0, 1, . . . , 7 shown at 331-0, 331-1, . . . , 331-7) each coupled to a respective sense amplifier (e.g., as shown for sense amplifier 0 at 306-0) via respective pass gates 307-1 and 307-2 and digit lines 305-1 and 305-2. For example, the pass gates can be connected as shown in FIG. 2 and can be controlled by an operation selection signal, Pass. For example, an output of the selection logic can be coupled to the gates of the pass gates 307-1 and 307-2 and digit lines 305-1 and 305-2. Corresponding pairs of the sense amplifiers and compute components can contribute to formation of the sensing circuitry indicated at 350-0, 350-1, . . . , 350-7.

Data values present on the pair of complementary digit lines 305-1 and 305-2 can be loaded into the compute component 331-0 as described in connection with FIG. 2. For example, when the pass gates 307-1 and 307-2 are enabled, data values on the pair of complementary digit lines 305-1 and 305-2 can be passed from the sense amplifiers to the compute component (e.g., 306-0 to 331-0). The data values on the pair of complementary digit lines 305-1 and 305-2 can be the data value stored in the sense amplifier 306-0 when the sense amplifier is fired.

The sense amplifiers 306-0, 306-1, . . . , 306-7 in FIG. 3 can each correspond to sense amplifier 206 shown in FIG. 2. The compute components 331-0, 331-1, . . . , 331-7 shown in FIG. 3 can each correspond to compute component 231 shown in FIG. 2. A combination of one sense amplifier with one compute component can contribute to the sensing circuitry (e.g., 350-0, 350-1, . . . , 350-7) of a portion of a DRAM memory subarray 325 configured to an I/O line 355 shared by a number of sensing component stripes for subarrays and/or latch components, as described herein. The paired combinations of the sense amplifiers 306-0, 306-1, . . . , 306-7 and the compute components 331-0, 331-1, . . . , 331-7, shown in FIG. 3, can be included in the sensing component stripe, as shown at 124 in FIG. 1C.

The configurations of embodiments illustrated in FIG. 3 are shown for purposes of clarity and are not limited to these configurations. For instance, the configuration illustrated in FIG. 3 for the sense amplifiers 306-0, 306-1, . . . , 306-7 in combination with the compute components 331-0, 331-1, . . . , 331-7 and the shared I/O line 355 is not limited to half the combination of the sense amplifiers 306-0, 306-1, . . . , 306-7 with the compute components 331-0, 331-1, . . . , 331-7 of the sensing circuitry being formed above the columns 322 of memory cells (not shown) and half being formed below the columns 322 of memory cells. Nor are the number of such combinations of the sense amplifiers with the compute components forming the sensing circuitry configured to couple to a shared I/O line limited to eight. In addition, the configuration of the shared I/O line 355 is not limited to being split into two for separately coupling each of the two sets of complementary digit lines 305-1 and 305-2, nor is the positioning of the shared I/O line 355 limited to being in the middle of the combination of the sense amplifiers and the compute components forming the sensing circuitry (e.g., rather than being at either end of the combination of the sense amplifiers and the compute components).

The circuitry illustrated in FIG. 3 also shows column select circuitry 358-1 and 358-2 that is configured to implement data movement operations with respect to particular columns 322 of a subarray 325, the complementary digit lines 305-1 and 305-2 associated therewith, and the shared I/O line 355 (e.g., as directed by the controller 140 shown in FIGS. 1A-1D). For example, column select circuitry 358-1 has select lines 0, 2, 4, and 6 that are configured to couple with corresponding columns, such as column 0 (332-0), column 2, column 4, and column 6. Column select circuitry 358-2 has select lines 1, 3, 5, and 7 that are configured to couple with corresponding columns, such as column 1, column 3, column 5, and column 7.

Controller 140 can be coupled to column select circuitry 358 to control select lines (e.g., select line 0) to access data values stored in the sense amplifiers, compute components, and/or present on the pair of complementary digit lines (e.g., 305-1 and 305-2 when selection transistors 359-1 and 359-2 are activated via signals from select line 0). Activating the selection transistors 359-1 and 359-2 (e.g., as directed by the controller 140) enables coupling of sense amplifier 306-0, compute component 331-0, and/or complementary digit lines 305-1 and 305-2 of column 0 (322-0) to move data values on digit line 0 and digit line 0* to shared I/O line 355. For example, the moved data values may be data values from a particular row 319 stored (cached) in sense amplifier 306-0 and/or compute component 331-0. Data values from each of columns 0 through 7 can similarly be selected by controller 140 activating the appropriate selection transistors.

Moreover, enabling (e.g., activating) the selection transistors (e.g., selection transistors 359-1 and 359-2) can enable a particular sense amplifier and/or compute component (e.g., 306-0 and/or 331-0, respectively) to be coupled with a shared I/O line 355 such that data values stored by an amplifier and/or compute component can be moved to (e.g., placed on and/or transferred to) the shared I/O line 355. In some embodiments, one column at a time is selected (e.g., column 322-0) to be coupled to a particular shared I/O line 355 to move (e.g., copy, transfer, and/or transport) the stored data values. In the example configuration of FIG. 3, the shared I/O line 355 is illustrated as a shared, differential I/O line pair (e.g., shared I/O line and shared I/O line*). Hence, selection of column 0 (322-0) could yield two data values (e.g., two bits with values of 0 and/or 1) from a row (e.g., row 319) and/or as stored in the sense amplifier and/or compute component associated with complementary digit lines 305-1 and 305-2. These data values could be input in parallel to each shared, differential I/O pair (e.g., shared I/O and shared I/O*) of the shared differential I/O line 355.

While example embodiments including various combinations and configurations of sensing circuitry, sense amplifiers, compute components, sensing component stripes, shared I/O lines, column select circuitry, multiplexers, latch components, latch stripes, and/or latches, etc., have been illustrated and described herein, embodiments of the present disclosure are not limited to those combinations explicitly recited herein. Other combinations and configurations of the sensing circuitry, sense amplifiers, compute components, sensing component stripes, shared I/O lines, column select circuitry, multiplexers, latch components, latch stripes, and/ or latches, etc., disclosed herein are expressly included within the scope of this disclosure.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A system, comprising:
a host configured to generate commands; and
a memory device, coupled to the host, comprising:
a plurality of banks of memory cells;
a controller coupled to the plurality of banks configured to:
receive a command from the host with instructions to transfer data between the plurality of banks, the command including source bank information and destination bank information; and
transfer the data on an internal data bus between the plurality of banks of memory cells via internal data path operations that use the source bank information to identify a source bank to read the data from and the destination bank information to identify a destination bank to write the data to, wherein the internal data path operations include performing a silent read command that transfers data from the plurality of banks to a number of bidirectional buffers isolated from a number of DQs.

2. The system of claim 1, wherein the data transferred between the plurality of banks includes program instructions for the memory device to perform operations on data stored in the plurality of banks.

3. The system of claim 1, wherein the source bank is identified by a first number of bits and the destination bank is identified by a second number of bits.

4. The system of claim 1, wherein the host comprises a processor coupled to the memory device via bus.

5. The system of claim 1, wherein the host is configured to send another command to the memory device to perform an operation using the data transferred between the plurality of banks.

6. The system of claim 1, wherein the internal data bus is coupled to an external data bus that is configured to transfer data between the plurality of banks of memory cells and the host.

7. The system of claim 6, wherein the internal data bus that couples the plurality of banks of memory cells together is coupled to a number of DQs to transfer data from the plurality of banks of memory cells.

8. A system, comprising:
a host configured to provide instructions for transferring data; and
a memory device, coupled to the host, comprising:
a plurality of banks of memory cells;
a controller coupled to the plurality of banks and configured to:

receive an instruction from the host to transfer data between the plurality of banks, the instruction including source bank information and destination bank information; and transfer data on an internal data bus between the plurality of banks of memory cells by performing a number of silent read commands that transfer data from the plurality of banks to a number of bidirectional buffers isolated from a number of DQ pins used to transfer data to an apparatus external to the plurality of banks of memory cells and a number of silent write commands that transfer data from the number of bidirectional buffers to the plurality of banks isolated from the number of DQ pins to the plurality of banks, wherein the number of DQ pins are used to transfer data to the apparatus external to the plurality of banks of memory cells, wherein the source bank information is used to identify a source bank to read data from and the destination bank information is used to identify a destination bank to write data to.

9. The system of claim 8, wherein the controller is configured to cause the memory device to perform an operation on data stored in the plurality of banks using program instructions in the data transferred between the plurality of banks according to the instruction from the host.

10. The system of claim 9, wherein a result of the operation is transferred from the memory device to the host.

11. The system of claim 9, wherein the host includes a channel controller configured to send a command to the memory device to perform the operation.

12. A method for operating a system, comprising:
sending a command from a host to a memory device to transfer data between a plurality of banks of the memory device; and
transferring the data from a first bank of memory cells on the memory device to a second bank of memory cells on the memory device on an internal data bus that couples the first bank to the second bank by executing the command that includes source bank information identifying a source bank to read the data from and destination bank information identifying a destination bank to write data to and by enabling bidirectional buffers for transferring data on the internal data bus based on the source bank information and destination bank information.

13. The method of claim 12, wherein transferring the data from the first bank to the second bank stores program instructions on the second bank for performing an operation on the memory device using sensing circuitry of the memory device.

14. The method of claim 13, further including performing the operation on the memory device using the program instructions stored on the second bank.

15. The method of claim 12, wherein transferring data from the first bank to the second bank includes transferring data on the internal data bus without transferring data on an external data bus.

16. The method of claim 12, wherein the method further comprises performing a silent read command that transfers the data from the first bank to a number of buffers isolated from a number of DQs on the internal data bus.

17. The method of claim 16, wherein the method further comprises performing a silent write command that transfers the data from the number of buffers isolated from the number of DQs on the internal data bus to the second bank.

18. The method of claim 12, wherein transferring data from the first bank of memory cells to the second bank of memory cells comprises performing a bank to bank data transfer command that identifies, simultaneously, the first bank as the source bank and the second bank as the destination bank.

* * * * *